(12) United States Patent
Shimizu et al.

(10) Patent No.: US 11,830,722 B2
(45) Date of Patent: Nov. 28, 2023

(54) METHOD OF MANUFACTURING PACKAGE UNIT, PACKAGE UNIT, ELECTRONIC MODULE, AND EQUIPMENT

(71) Applicant: CANON KABUSHIKI KAISHA, Tokyo (JP)

(72) Inventors: Koichi Shimizu, Fujisawa (JP); Satoru Hamasaki, Fujisawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 18/159,132

(22) Filed: Jan. 25, 2023

(65) Prior Publication Data

US 2023/0163147 A1 May 25, 2023

Related U.S. Application Data

(63) Continuation of application No. 16/817,847, filed on Mar. 13, 2020, now Pat. No. 11,587,964.

(30) Foreign Application Priority Data

Mar. 22, 2019 (JP) .................................. 2019-055107

(51) Int. Cl.
*H01L 27/146* (2006.01)
*H01L 23/053* (2006.01)
(Continued)

(52) U.S. Cl.
CPC ...... *H01L 27/14618* (2013.01); *H01L 23/053* (2013.01); *H01L 24/48* (2013.01);
(Continued)

(58) Field of Classification Search
CPC .............................................. H01L 27/14618
See application file for complete search history.

(56) References Cited

U.S. PATENT DOCUMENTS 5,214,846 A   6/1993   Asami et al.
5,216,278 A *   6/1993   Lin .................... H01L 23/49816
                                                  257/E23.079
(Continued)

FOREIGN PATENT DOCUMENTS

JP   63-242072 A   10/1988
JP   5-218230 A   8/1993
(Continued)

OTHER PUBLICATIONS

Notice of Reasons for Refusal issued in Japanese Application No. 2019-055107 (dated Mar. 2023).

*Primary Examiner* — William A Harriston
(74) *Attorney, Agent, or Firm* — VENABLE LLP

(57) ABSTRACT

A method of manufacturing a package unit, comprising: preparing a circuit board having a first region, a second region surrounding the first region, and a third region between the first and the second region; preparing a mold having a frame-shaped protruding portion surrounding a first cavity, the frame-shaped protruding portion partitioning the first cavity and a second cavity surrounding the first cavity; arranging the circuit board and the mold such that the first region of the circuit board faces the first cavity, the second region of the circuit board faces the second cavity, and a gap which communicates the first cavity and the second cavity with each other is formed between the frame-shaped protruding portion and the third region of the circuit board; and forming a frame-shaped resin member on top of the second region of the circuit board by pouring a resin into the second cavity.

20 Claims, 17 Drawing Sheets

(51) Int. Cl.
*H05K 1/03* (2006.01)
*H05K 1/18* (2006.01)
*H05K 3/46* (2006.01)
*H01L 23/00* (2006.01)
*H05K 3/00* (2006.01)

(52) U.S. Cl.
CPC ........... *H05K 1/0373* (2013.01); *H05K 1/181* (2013.01); *H05K 3/0014* (2013.01); *H05K 3/4644* (2013.01); *H01L 2224/48227* (2013.01); *H05K 2201/09036* (2013.01); *H05K 2201/10121* (2013.01)

(56) References Cited

U.S. PATENT DOCUMENTS

| | | | | |
|---|---|---|---|---|
| 5,646,827 | A * | 7/1997 | Hirao | H05K 5/064 361/752 |
| 5,859,759 | A * | 1/1999 | Moriyama | G01L 19/0084 361/283.4 |
| 5,977,626 | A * | 11/1999 | Wang | H01L 23/49816 257/691 |
| 6,400,014 | B1 * | 6/2002 | Huang | H01L 23/4334 257/E23.092 |
| 7,317,199 | B2 * | 1/2008 | Inoguchi | H01L 24/97 250/214 R |
| 7,436,435 | B2 | 10/2008 | Wada et al. | |
| 7,781,852 | B1 * | 8/2010 | Faheem | G01L 19/147 257/434 |
| 7,787,250 | B2 * | 8/2010 | Li | H01L 23/04 361/720 |
| 8,410,375 | B2 | 4/2013 | Matsushita et al. | |
| 2002/0119602 | A1 * | 8/2002 | Yonemochi | H01L 23/4334 257/E23.092 |
| 2004/0264156 | A1 * | 12/2004 | Ajioka | H01L 23/552 257/E25.031 |
| 2006/0116012 | A1 * | 6/2006 | Lin | H05K 7/12 439/131 |
| 2007/0246810 | A1 * | 10/2007 | Retuta | H01L 23/3107 257/678 |
| 2008/0283987 | A1 | 11/2008 | Kuwabara | |
| 2011/0074048 | A1 | 3/2011 | Shibita et al. | |
| 2012/0235308 | A1 | 9/2012 | Takahashi | |
| 2019/0019826 | A1 | 1/2019 | Gotou et al. | |
| 2019/0294213 | A1 | 9/2019 | Katase et al. | |

FOREIGN PATENT DOCUMENTS

| | | |
|---|---|---|
| JP | 2002-009265 A | 1/2002 |
| JP | 2003-110929 A | 4/2003 |
| JP | 2003-249603 A | 9/2003 |
| JP | 2003-303946 A | 10/2003 |
| JP | 2005-166694 A | 6/2005 |
| JP | 2006-156815 A | 6/2006 |
| JP | 2009-094195 A | 4/2009 |
| JP | 2010-109252 A | 5/2010 |
| JP | 2015-185763 A | 10/2015 |
| JP | 2016-076669 A | 5/2016 |
| JP | 2017-117833 A | 6/2017 |
| WO | 2009/150820 A1 | 12/2009 |

* cited by examiner

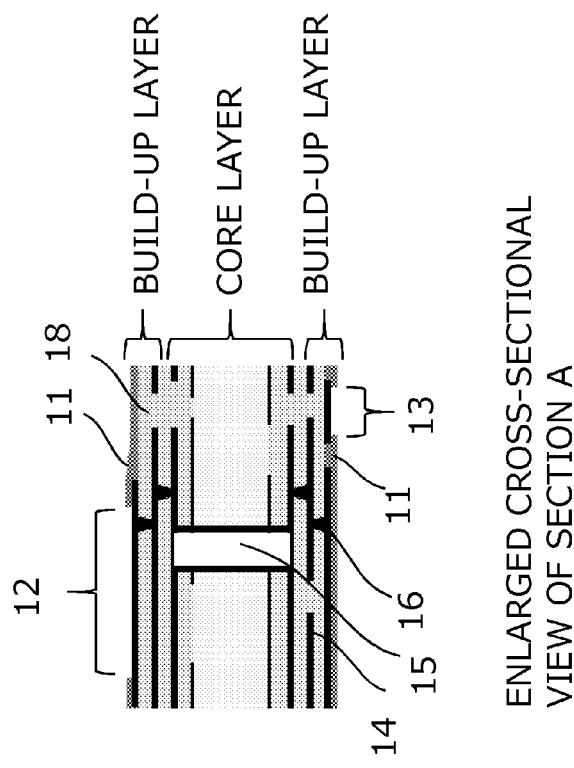
FIG. 1A-1
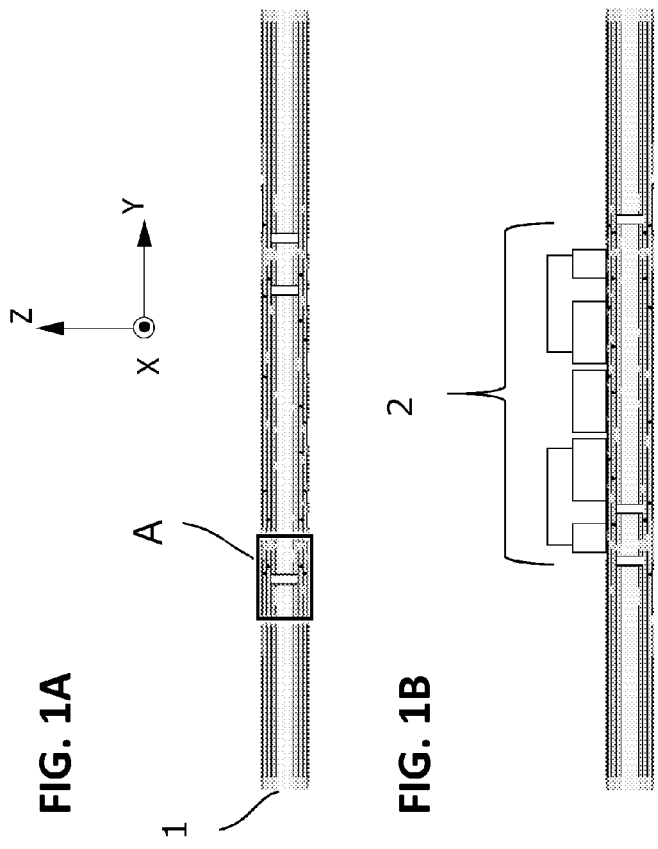
FIG. 1A
FIG. 1B

Z-DIRECTION PLAN VIEW

ENLARGED CROSS-SECTIONAL
VIEW OF SECTION C2

ENLARGED CROSS-SECTIONAL
VIEW OF SECTION C1

ENLARGED CROSS-SECTIONAL VIEW OF SECTION E

ENLARGED CROSS-SECTIONAL VIEW OF SECTION G1

ENLARGED CROSS-SECTIONAL VIEW OF SECTION G2

Z-DIRECTION PLAN VIEW

ENLARGED CROSS-SECTIONAL VIEW OF SECTION h2

ENLARGED CROSS-SECTIONAL VIEW OF SECTION h1

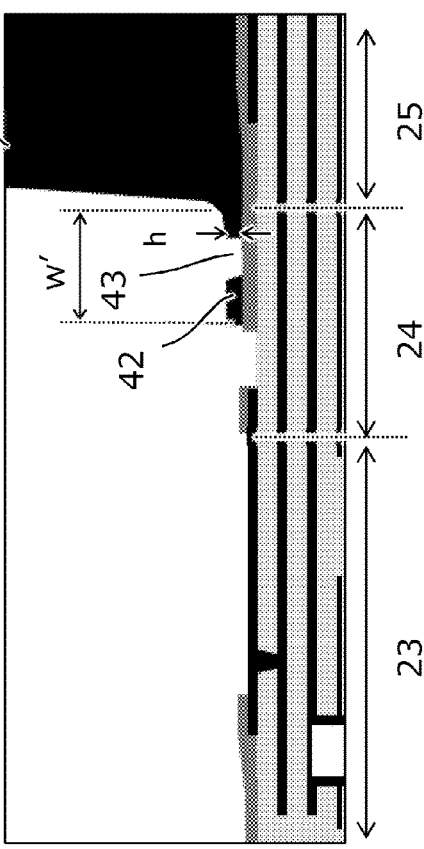
FIG. 1H-4 ENLARGED CROSS-SECTIONAL VIEW OF SECTION H1
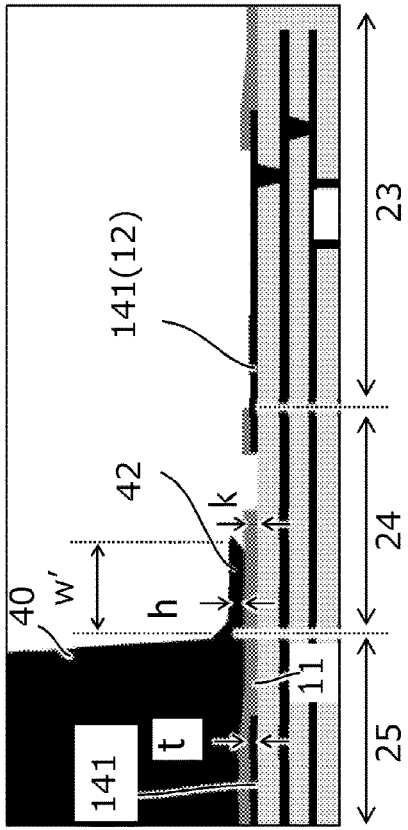
FIG. 1H-5 ENLARGED CROSS-SECTIONAL VIEW OF SECTION H2
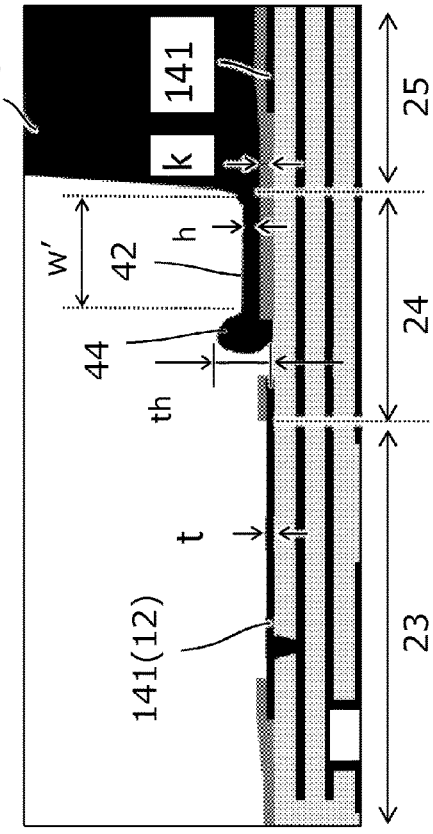
FIG. 1H-6 ENLARGED CROSS-SECTIONAL VIEW OF SECTION H3

YZ CROSS-SECTIONAL VIEW

Z-DIRECTION PLAN VIEW

Z-DIRECTION PLAN VIEW

ENLARGED CROSS-SECTIONAL
VIEW OF SECTION A1

ENLARGED CROSS-SECTIONAL
VIEW OF SECTION A2

ENLARGED CROSS-SECTIONAL
VIEW OF SECTION A3

ENLARGED CROSS-SECTIONAL
VIEW OF SECTION A4

Z-DIRECTION PLAN VIEW OF PRINTED CIRCUIT BOARD

ENLARGED CROSS-SECTIONAL VIEW OF SECTION D2 (STEP a)

Z-DIRECTION PLAN VIEW OF PRINTED CIRCUIT BOARD (STEP b)

ENLARGED CROSS-SECTIONAL VIEW OF SECTION D2 (STEP b)

Z-DIRECTION PLAN VIEW

ENLARGED CROSS-SECTIONAL VIEW OF SECTION G2

ENLARGED CROSS-SECTIONAL VIEW OF SECTION G1

Z-DIRECTION PLAN VIEW OF PRINTED CIRCUIT BOARD

ENLARGED CROSS-SECTIONAL VIEW OF SECTION B2 (STEP a)

ENLARGED CROSS-SECTIONAL VIEW OF SECTION B2 (STEP b)

ENLARGED CROSS-SECTIONAL VIEW OF SECTION B2 (STEP d)

ENLARGED CROSS-SECTIONAL VIEW OF SECTION B2 (STEP c)

Z-DIRECTION PLAN VIEW OF PRINTED CIRCUIT BOARD

ENLARGED CROSS-SECTIONAL VIEW OF SECTION A2 (STEP a)

ENLARGED CROSS-SECTIONAL VIEW OF SECTION A2 (STEP b)

ENLARGED CROSS-SECTIONAL VIEW OF SECTION A2 (STEP c)

METHOD OF MANUFACTURING PACKAGE UNIT, PACKAGE UNIT, ELECTRONIC MODULE, AND EQUIPMENT

CROSS REFERENCE TO RELATED APPLICATIONS

This application is a continuation application of U.S. patent application Ser. No. 16/817,847, filed Mar. 13, 2020, which claims the benefit of Japanese Patent Application No. 2019-55107, filed on Mar. 22, 2019. Each of these prior applications is hereby incorporated by reference herein in its entirety.

BACKGROUND OF THE INVENTION

Field of the Invention

The present invention relates to a method of manufacturing a package unit, a package unit, an electronic module, and an equipment.

Description of the Related Art

In recent years, the number of pixels and frame rates of solid-state imaging elements have increased and, further, progress has been made in digitization of output. Accordingly, there is a greater need to increase transmission speeds of output signals of the solid-state imaging elements. To this end, high-speed serial transmission such as LVDS (Low Voltage Differential Signaling) and SLVS (Scalable Low Voltage Signaling) has become established practice.

Therefore, since handled signals have smaller amplitudes and higher rates, inductance of wiring of a package (a package unit), noise due to a power supply-GND loop transmission magnetic field, crosstalk, and the like are no longer negligible. Furthermore, since a high-speed transmission signal is transmitted with a small amplitude, transmission wiring must be impedance-matched wiring with low power loss. To this end, efforts are made to shorten wiring of a power supply or output of an image sensor by directly mounting an image sensing element to a circuit board mounted with electronic components, reduce impedance mismatches, and the like.

Against this backdrop, Japanese Patent Application Laid-open No. 2015-185763 discloses a technique for forming a frame-shaped mold portion that surrounds an outer periphery of a circuit board and forming a package capable of housing an electronic device. This method enables generation of dust from a circuit board end surface to be suppressed by molding the board end surface using resin and can be described as a promising technique.

However, in Japanese Patent Application Laid-open No. 2015-185763, since the circuit board is clamped with a mold when the circuit board is inserted thereinto, problems arise such as an occurrence of a crack in the circuit board in a portion where the mold and a circuit board surface come into contact with each other and deformation of internal wiring.

WO 2009/150820 discloses a technique for similarly inserting a circuit board into a mold and performing resin molding. The technique prevents the circuit board from sustaining damage by roundly chamfering corners of the mold in a boundary portion of a region where the mold and the circuit board come into contact with each other and providing a board surface with recesses in the boundary portion of the region.

However, while the method disclosed in WO 2009/150820 is capable of reducing damage to the circuit board in the boundary portion of the region where the mold and the circuit board come into contact with each other, there is a problem that a resin material of the circuit board is likely to sustain significant damage. In particular, when there is a variation in a thickness of the circuit board, pressure applied to the circuit board over an entire contact region between the circuit board and the mold increases and significant damage occurs in a conductor layer directly underneath the contact region or in the resin material of the circuit board.

SUMMARY OF THE INVENTION

In consideration of the circumstances described above, an object of the present invention is to provide a highly reliable package unit.

The first aspect of the disclosure is a method of manufacturing a package unit, comprising: preparing a circuit board having a first region, a second region which surrounds the first region, and a third region between the first region and the second region; preparing a mold having a frame-shaped protruding portion which surrounds a first cavity, the frame-shaped protruding portion partitioning the first cavity and a second cavity which surrounds the first cavity; arranging the circuit board and the mold such that the first region of the circuit board faces the first cavity, the second region of the circuit board faces the second cavity, and a gap which communicates the first cavity and the second cavity with each other is formed between the frame-shaped protruding portion and the third region of the circuit board; and forming a frame-shaped resin member on top of the second region of the circuit board by pouring a resin into the second cavity.

The second aspect of the disclosure is a method of manufacturing a package unit, comprising: preparing a circuit board having a first region, a second region which surrounds the first region, and a third region between the first region and the second region; preparing a mold having a frame-shaped protruding portion which surrounds a first cavity, the first cavity and a second cavity which surrounds the first cavity being partitioned by the frame-shaped protruding portion; arranging the circuit board and the mold such that the first region of the circuit board faces the first cavity, the second region of the circuit board faces the second cavity, and the frame-shaped protruding portion overlaps with the third region of the circuit board; and forming a frame-shaped resin member on top of the second region of the circuit board by pouring a resin into the second cavity, wherein a solder resist layer is arranged in the third region at a position which overlaps with the frame-shaped protruding portion, and the solder resist layer of the third region is positioned between a conductor layer arranged in the first region and a conductor layer arranged in the second region.

The third aspect of the disclosure is a package unit, comprising: a circuit board having a first region, a second region which surrounds the first region, and a third region between the first region and the second region; and a resin member which covers the circuit board so as to surround a space above the first region of the circuit board, wherein the resin member has (1) a first resin portion which is arranged above the second region of the circuit board and (2) a second resin portion which extends above the third region of the circuit board from the first resin portion and which has a thickness smaller than half of the first resin portion.

According to the present invention, a highly reliable package unit can be provided.

Further features of the present invention will become apparent from the following description of exemplary embodiments with reference to the attached drawings.

BRIEF DESCRIPTION OF THE DRAWINGS

FIGS. 1A to 1H-6 are diagrams illustrating a method of manufacturing a package unit according to a first embodiment;

DESCRIPTION OF THE EMBODIMENTS

Figure 1C:
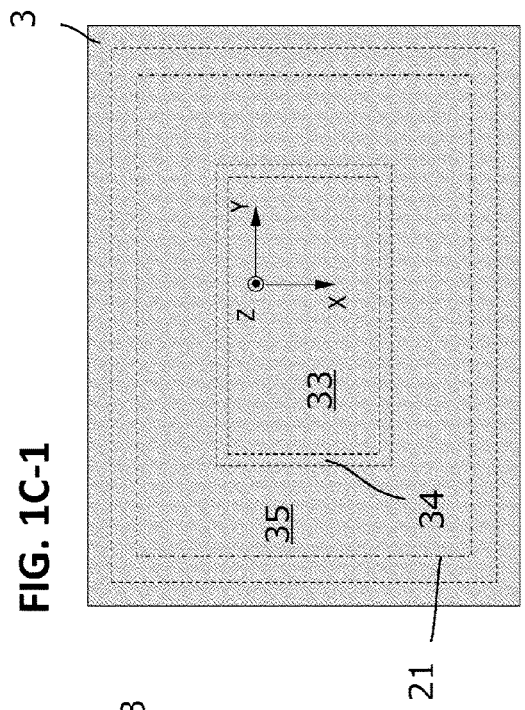

Hereinafter, embodiments of the present invention will be described with reference to the drawings.

First Embodiment

A method of manufacturing a package unit according to a first embodiment of the present invention will be described. FIGS. 1A to 1G sequentially show each step of the method of manufacturing a package unit.

FIG. 1A shows a cross-sectional view of a stage where a circuit board 1 has been prepared. In this case, a coordinate system is assumed to be a coordinate system depicted by XYZ in the drawing. A plate-like substrate including a wiring conductor can be used as the circuit board 1, and the circuit board 1 is typically a printed circuit board (PCB). While the circuit board 1 may be a substrate made of an inorganic material such as a silicon substrate, a ceramic substrate, a glass substrate, or a metal substrate, a resin substrate is preferable since a copper foil with low electric resistivity can be readily used as a circuit conductor. Among resin substrates, a composite material substrate containing a fibrous or granular filler in resin such as a glass-epoxy substrate is particularly preferable. FIG. 1A is a cross-sectional view in a case where a resin substrate is used as the circuit board 1.

Figures 1, 1C:
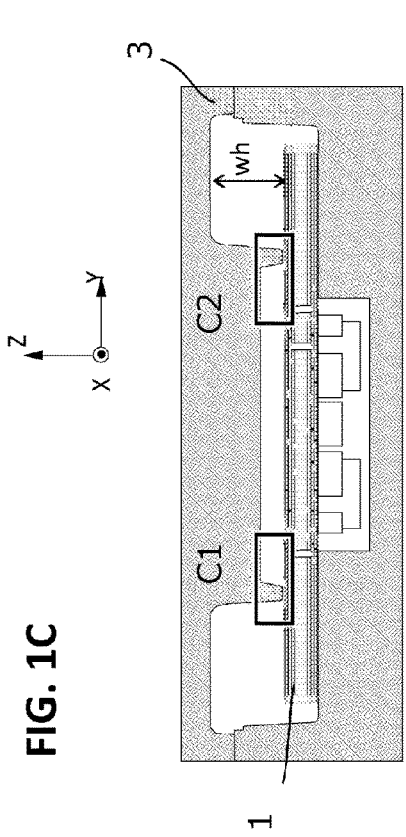

FIG. 1A-1 is an enlarged cross-sectional view of section A showing details of a layered structure of the circuit board 1. In this case, an example is shown where the circuit board 1 is a so-called 2-4-2 build-up substrate which has a core layer including four conductor layers 14 and two conductor layers 14 respectively provided as build-up layers on front and rear surfaces of the core layer. The conductor layers 14 are formed of, for example, copper foil. Each conductor layer 14 is patterned into a desired pattern by lithography.

The core layer and the build-up layers include a prepreg layer 18. The prepreg layer 18 is configured such that fibers woven or knitted into a cloth pattern are impregnated with a resin. As the resin which the fibers are to be impregnated with, resins having epoxy or phenol as a main component can be widely used, and resins containing an insulating filler such as paper or glass can also be used. Furthermore, while glass fibers are generally used as the fibers, the fibers are not limited thereto as long as the fibers have an insulating property.

In addition, a solder resist layer 11 is provided on front and rear surfaces of the circuit board 1. Mainly, there are two methods of forming the solder resist layer 11 as described below. A first method involves pasting a dry film to the front and rear surfaces of the circuit board 1 and performing patterning by lithography in order to provide an opening at a desired location. A second method involves applying a liquid resist using a roll coater or a spray coater and, after curing the liquid resist by UV or heat, performing patterning in a similar manner.

A front surface electrode 12 is an electrode for connecting wiring from an electronic device. A rear surface electrode 13 is an electrode for connecting electronic components. The front surface electrode 12 is a conductor layer 14 exposed to the front surface and the rear surface electrode 13 is a conductor layer 14 exposed to the rear surface. Conduction between the front surface electrode 12 and the rear surface electrode 13 is realized along a desired path via the conductor layers 14, a laser via 16, and a drilled via 15.

Figure 8A:
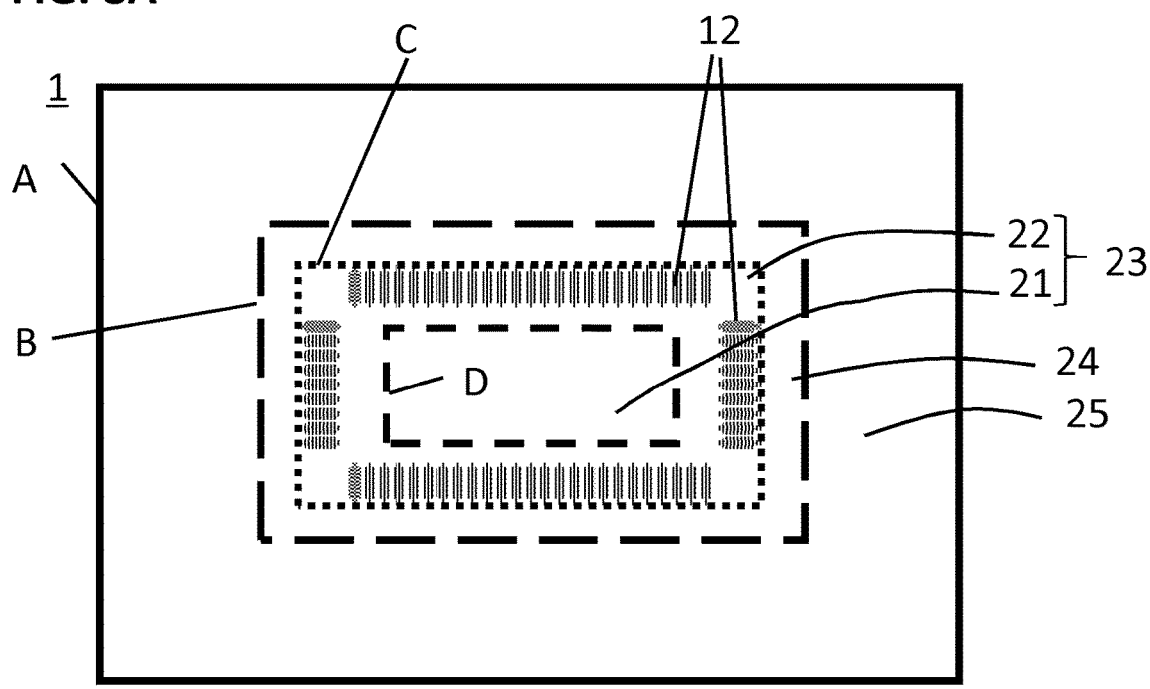
FIGS. 8A and 8B are diagrams illustrating a circuit board used in the method of manufacturing a package unit.
Figure 8B:
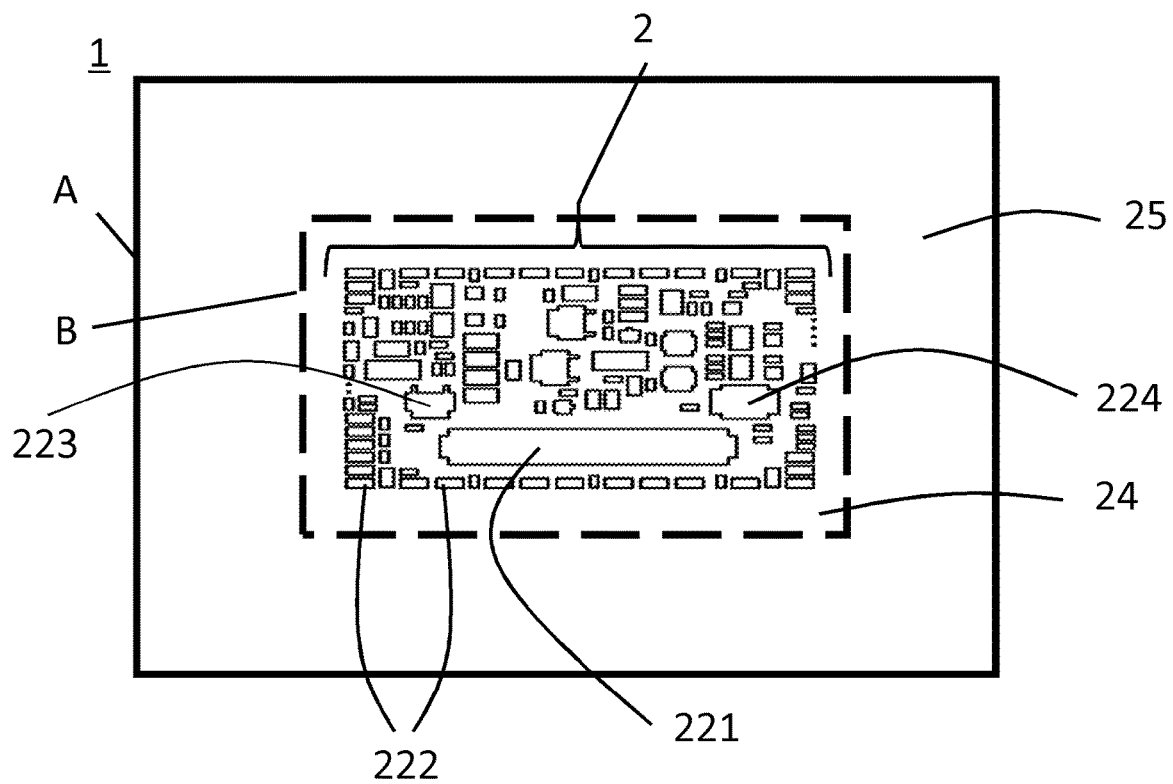

FIG. 8A is a plan view of the front surface of the circuit board 1 and FIG. 8B is a plan view of the rear surface of the circuit board 1.

In FIG. 8A, a solid line A indicates a position of an end surface of the printed circuit board 1. A region surrounded by a dotted line C is a central region (a first region) 23. A region between the solid line A and a long dashed line B is a peripheral region (a second region) 25. A region between the long dashed line B and the dotted line C or, in other words, a region between the peripheral region 25 and the central region 23 is an intermediate region (a third region) 24. The peripheral region 25 surrounds the central region 23, and the intermediate region 24 also surrounds the central region 23. On a front surface-side of the circuit board 1, a resin frame 41 is provided above the peripheral region 25. On the front surface-side of the printed circuit board 1, an electronic device is provided in a central portion on the central region 23. Among the central region 23, a region surrounded by a short dashed line D is a mounting region 21 where the electronic device is to be mounted. Among the central region 23, a region between the dotted line C and the short dashed line D (a peripheral portion) is a connecting region 22 for connecting the electronic device to the printed circuit board 1. A plurality of the front surface electrodes 12 are arranged in the connecting region 22. In order to ensure that the electronic device can be stored in a package unit, a thickness (a height) of the electronic device is smaller than a thickness wh of a frame-shaped resin portion 40 and greater than a thickness h of an extended resin portion 42 to be described later.

As shown in FIG. 8B, an electronic component group 2 is provided on a rear surface side of the printed circuit board 1. Electronic components that constitute the electronic component group 2 include a connector 221, passive components 222 such as a resistor, a capacitor, and a diode, active components 223 such as a transistor, and an integrated circuit chip 224. In the example shown in FIG. 8B, while the electronic component group 2 is only provided in the central region 23 and not provided in the peripheral region 25 on a rear surface-side of the circuit board 1, alternatively, at least a part of the electronic components of the electronic component group 2 can be arranged in the peripheral region 25.

FIG. 1B shows a step of mounting the electronic components 2 to the rear surface of the circuit board 1. The electronic components 2 are soldered and connected to the rear surface of the circuit board 1 by a known surface mounting method. Specifically, first, the circuit board 1 is arranged so that the rear surface is an upper surface, and a print mask having an opening that matches an arrangement of the provided rear surface electrode 13 is prepared. Next, the print mask is brought into contact with the rear surface so that the opening and the rear surface electrode 13 match each other. In this state, a solder paste is arranged on the mask and the solder paste is printed on the rear surface of the circuit board 1 using a squeegee.

Next, using a known mounter, desired components are mounted to the rear surface of the circuit board 1 so that the rear surface electrode 13 and a terminal of each electronic component match each other. Finally, the circuit board 1 is passed through a reflow furnace in this state to complete solder bonding between the rear surface electrode 13 and the terminal of each electronic component.

When flux contained in the solder paste falls off from the circuit board 1 and adheres onto an electronic device in subsequent steps, the flux causes a decline in yield. Therefore, the flux is desirably cleaned using a known cleaner and a known cleaning solution.

It is preferable to mount electronic components for surface mounting. Examples of types of surface-mounting electronic components include a ceramic capacitor, an organic capacitor made of tantalum or the like, a chip resistor, a B-to-B connector, a regulator IC for a power supply, a common-mode connector coil, a temperature measurement IC, and an EPROM.

Figure 2A:
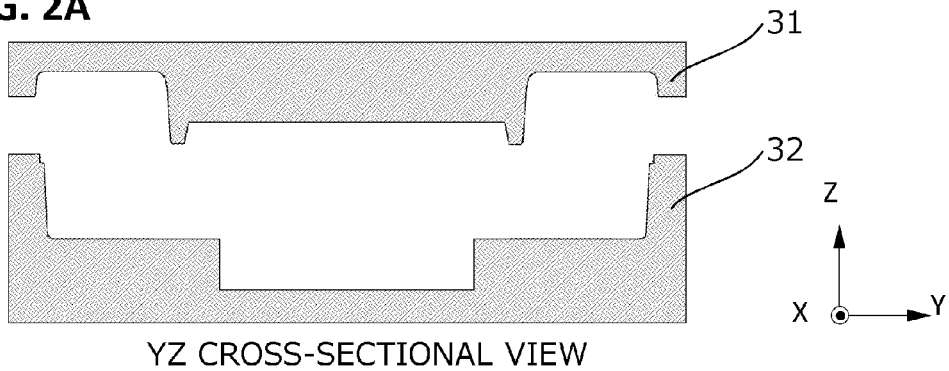
FIGS. 2A to 2C are diagrams illustrating a mold used in the method of manufacturing a package unit.
Figure 2B:
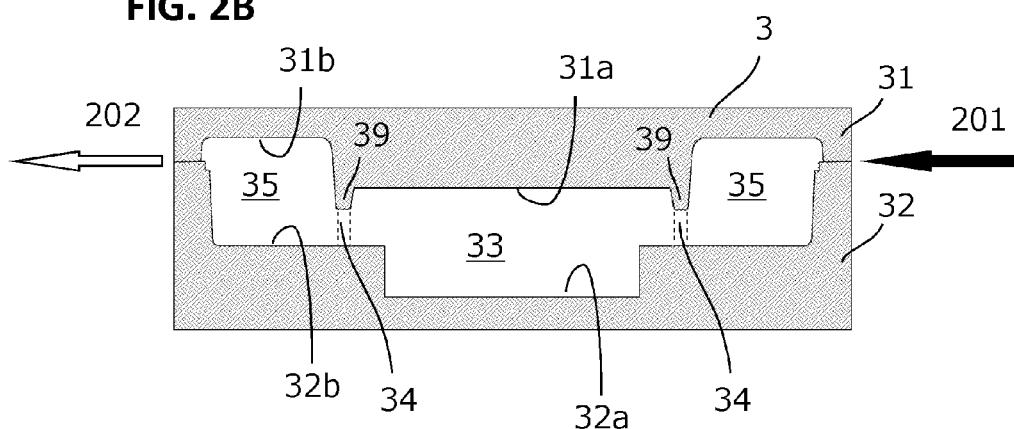
Figure 2C:
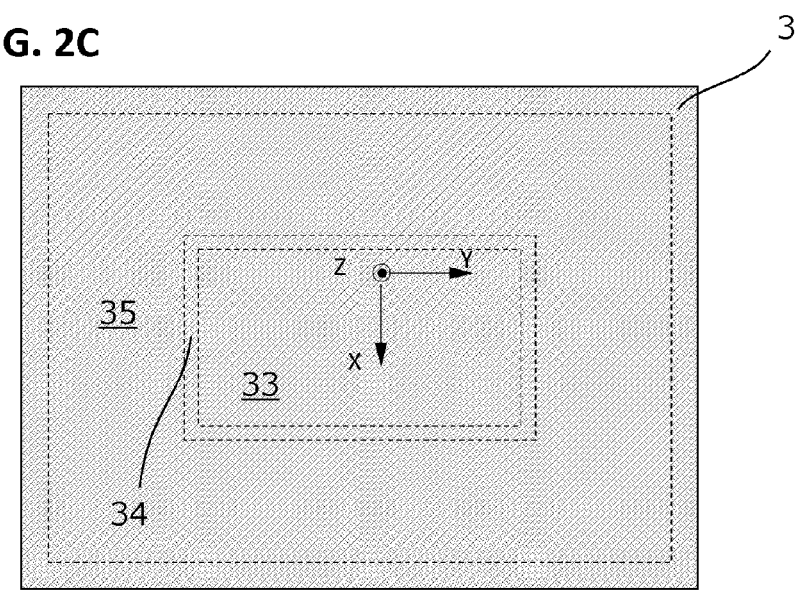

FIGS. 2A to 2C exclusively illustrate a mold 3 used in the present embodiment. A coordinate system is indicated by XYZ in a similar manner to FIG. 1A. The mold 3 is constituted by an upper mold 31 and a lower mold 32. FIG. 2A shows a state where the mold 3 is opened and FIG. 2B shows a state where the mold 3 is closed. In the state where the mold 3 is closed, a cavity is formed inside the mold 3.

FIG. 2C is a Z-direction plan view in which the mold 3 is viewed from a Z direction of the coordinate system shown in FIG. 2A and, in the diagram, a dashed line represents a boundary line by which the cavity formed inside the mold 3 is divided into three portions. In this manner, the cavity is constituted by a central cavity (a first cavity) 33, a frame-shaped narrow cavity 34 provided on an outer periphery of the central cavity 33, and a frame-shaped cavity (a second cavity) 35 provided on an outer periphery of the frame-shaped narrow cavity 34.

The lower mold 32 has a first bottom surface 32a in a central portion of a region corresponding to the central cavity 33 and a second bottom surface 32b in a region corresponding to a peripheral portion of the central cavity 33, the frame-shaped narrow cavity 34, and the frame-shaped cavity 35. The first bottom surface 32a is positioned lower in the Z-direction than the second bottom surface 32b and is capable of avoiding interference with the electronic components 2 when the circuit board 1 is arranged on the second bottom surface 32b. The upper mold 31 has a first ceiling surface 31a in a region corresponding to the central cavity 33, a second ceiling surface 31b in a region corresponding to the frame-shaped cavity 35, and a frame-shaped protruding portion 39 between the first ceiling surface 31a and the second ceiling surface 31b. The frame-shaped narrow cavity 34 is formed directly underneath the frame-shaped protruding portion 39, and the central cavity 33 and the frame-shaped cavity 35 are partitioned by the frame-shaped protruding portion 39. A height in the Z-direction of a lower surface of the frame-shaped protruding portion 39 is lower than the first ceiling surface 31a, and a height in the z-direction of the first ceiling surface 31a is lower than the second ceiling surface 31b.

In addition, the mold 3 is provided with a gate (not illustrated) for injecting resin in a direction indicated by an arrow 201 in FIG. 2B and an air vent (not illustrated) for releasing air having been forced out by resin in a direction indicated by an arrow 202.

FIG. 1C shows a state where the circuit board 1 is inserted into the mold 3. FIG. 1C-1 is a z-direction plan view of FIG. 1C, and FIG. 1C-2 and FIG. 1C-3 are each enlarged cross-sectional views of section C1 and section C2 in FIG. 1C.

As shown in FIG. 1C-1, an entire outer periphery 21 of the circuit board 1 is included inside the frame-shaped cavity 35 in this state. In addition, the central region 23 of the circuit board 1 is included in the central cavity 33, the peripheral region 25 is included in the frame-shaped cavity 35, and the intermediate region 24 is included in the frame-shaped narrow cavity 34 (the frame-shaped protruding portion 39). It should be noted that the entire intermediate region 24 and the frame-shaped protruding portion 39 need not oppose each other, and an end portion on a side of the central region 23 among the intermediate region 24 may be included in the central cavity 33. Furthermore, as shown in FIGS. 1C-2 and 1C-3, a gap 36 is provided between a bottom surface of the frame-shaped protruding portion 39 and the front surface of the circuit board 1. The central cavity 33 and the frame-shaped cavity 35 are communicated via the gap 36. In this manner, in the first embodiment, the circuit board 1 is not clamped by the mold 3 in a state where the circuit board 1 is inserted into the mold 3. Therefore, an occurrence of damages such as a crack in the circuit board 1 and a deformation or a fracture of the conductor layers 14 which have been problems in the past can be prevented.

FIGS. 1D to 1G show respective steps of pouring resin into the frame-shaped cavity 35 via the gate (not illustrated), filling resin 41 while discharging excess air from the air vent (not illustrated), and completing molding while maintaining the state shown in FIG. 1C. Due to these steps, a resin mold that covers the outer periphery of the circuit board is molded.

As the resin 41, a material having necessary strength and profile stability for the electronic module can be used. In addition, desirably, the resin 41 does not contain halogens that adversely affect the electronic device in a use environment of the electronic module and substances which dissolve into moisture over a long period of time and which condense and precipitate on a surface of a translucent LID that is a lid of the package unit.

Injection molding can be performed as a molding method. Examples of thermoplastic resins used in injection molding include polyethylene resin, polypropylene resin, ethylene-vinyl acetate, polystyrene, AS resin, ABS resin, acrylic resin, polyvinyl chloride, cellulosic resin, polyacetal, polyamide, polyethylene terephthalate, polybutylene terephthalate, polycarbonate, modified polyphenylene ether, polyphenylene sulfide, polyether ether ketone, liquid crystal polymer, polysulfone, polyether sulfone, polyarylate, polyamide-imide, polyetherimide, and polymethyl pentene.

However, a thermosetting resin is preferable in order to stably maintain strength and shape in a wide temperature range from −40° C. to 130° C. While phenolic resin, urea resin, melamine resin, diallyl phthalate resin, unsaturated polyester resin, polyimide resin, urethane resin, and the like can also be used as the thermosetting resin, resins having epoxy resin as a main component are preferable. In particular, favorable resin is based on bisphenol A or novolac glycidyl ether-type resin and compounded with an aromatic amine curing agent, a phenolic resin curing agent, or an acid anhydride curing agent, and a filler. As the filler, a filler containing approximately 70 to 85 percent by weight of silica powder, talc, or the like is preferable due to a dimensional variation after molding being small. In addition, including a releasing agent for enhancing releasability from the mold 3 and a fire retardant is also known.

In the case of the present embodiment, transfer molding capable of keeping fill pressure of the resin 41 relatively low is more preferable. In the case of transfer molding, a thermosetting resin is used. Resin materials with powder resin as a main component and including a curing agent, a releasing agent, a coupling agent, a flame retardant, and the like are shaped in advance into a cylindrical tablet and the resin tablet is placed inside a pot to be preheated. In a state where the resin has been melted by the preheating and viscosity has dropped to within 10 to 100 Pa·s, the resin 41 is extruded from the pot with a plunger and injected into the cavity via a cull, a runner, and a gate. It should be noted that, generally, the mold 3 is preheated in advance to a temperature ranging from 100° C. to 200° C. which is higher than a glass-transition temperature of the resin 41.

Figures 1, 1C, 2, 3:
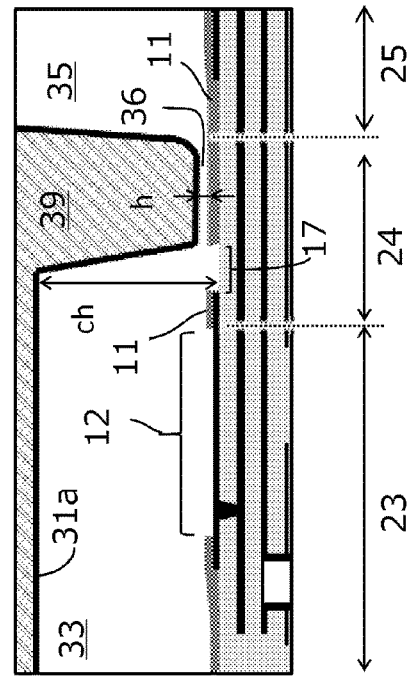
Figures 1, 1C, 2:
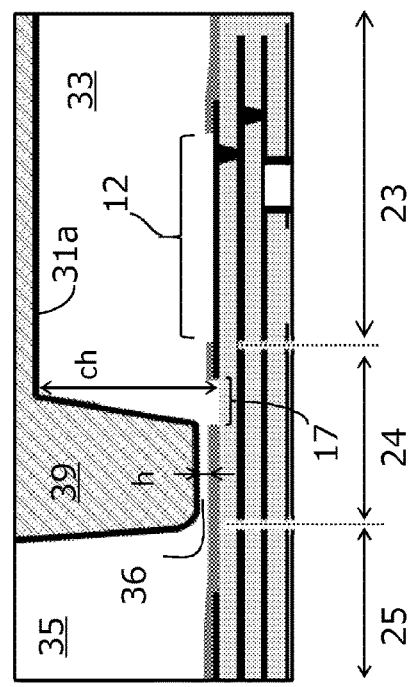
Figure 1D:
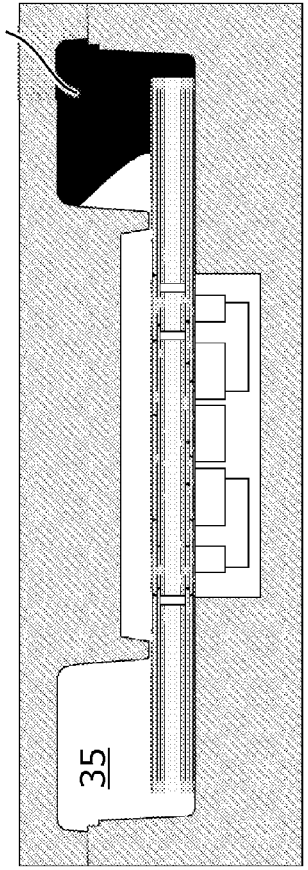
Figure 1E:
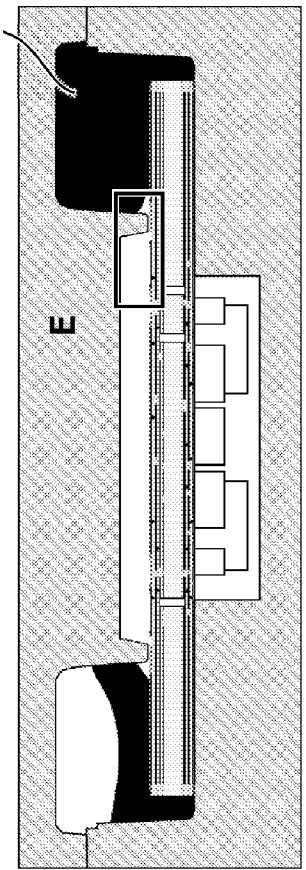
Figures 1, 1E:
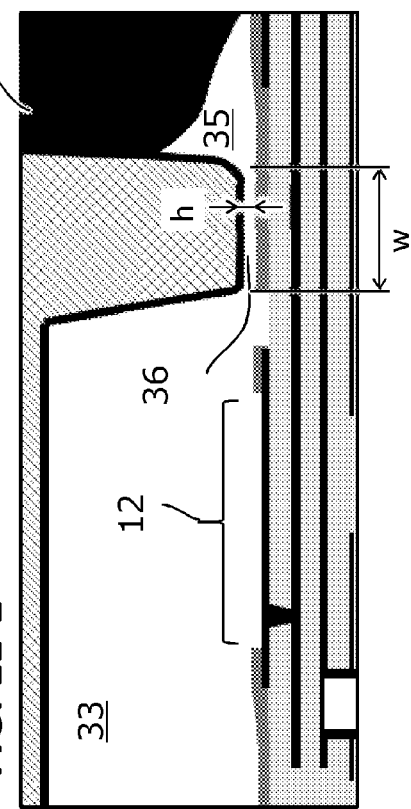
Figure 1F:
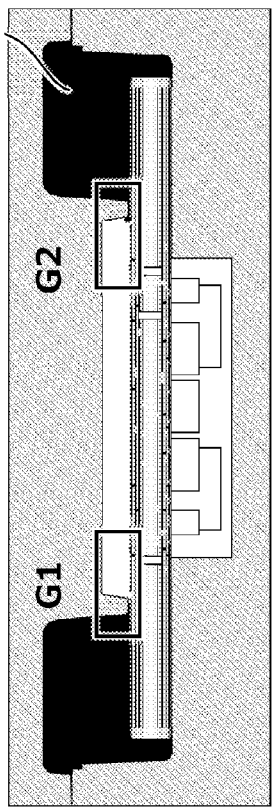

From FIG. 1D to FIG. 1E, the resin 41 injected from the gate advances so as to fill the frame-shaped cavity 35. Air in the portions to which the resin enters is discharged from the air vent (not illustrated). At this stage, pressure of the resin 41 is relatively low. Once a stage shown in FIG. 1F is reached, the pressure of the resin 41 starts to rise and, eventually, filling is completed in a stage shown in FIG. 1G at pressure ranging from 5 to 80 MPa. In the stage shown in FIG. 1G, a part of the resin 41 penetrates into the gap 36 from the frame-shaped cavity 35.

A height h of the gap 36 shown in an enlarged cross-sectional view of section E in FIG. 1E-1 is defined by the front surface of the circuit board 1 and a top plane of the frame-shaped protruding portion 39 and a value thereof is approximately constant. The height h of the gap 36 is, for example, 0.5 μm or more and 500 μm or less and preferably ranges from 5 to 50 μm. In addition, a width w of the frame-shaped narrow cavity 34 shown in the enlarged cross-sectional view of section E in FIG. 1E-1 preferably ranges from 0.1 to 1 mm.

Figure 1G:
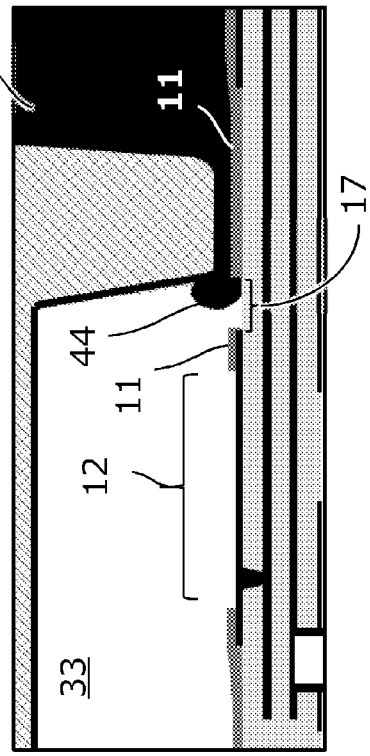
Figures 1, 1G:
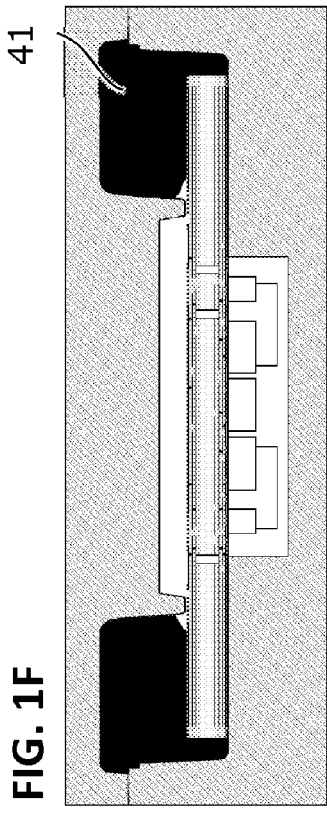
Figures 1, 1G, 2:
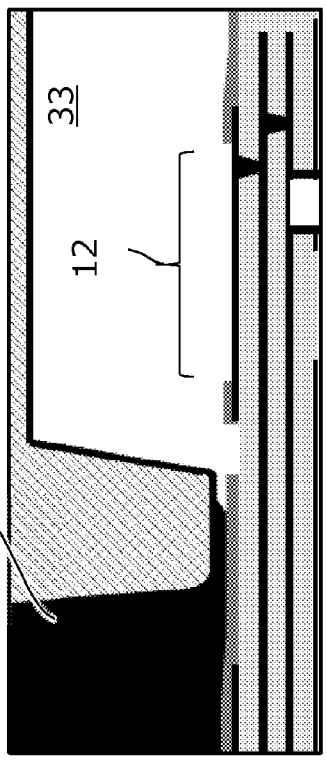

As shown in an enlarged cross-sectional view of section G1 in FIG. 1G-1, desirably, the resin 41 stays inside the gap 36 or, in other words, the resin 41 does not advance to the central cavity 33. Under conditions of the resin viscosity and the gap shape according to the present embodiment, the resin 41 can be more or less kept inside the gap 36 by setting the pressure of the resin 41 in the stage shown in FIG. 1G within a range of 5 to 80 MPa. This is because a flow resistance of the gap 36 with respect to the resin 41 is sufficiently high and, therefore, a flow rate of the resin 41 to the gap 36 is sufficiently slowed, and a curing reaction of the resin 41 can be advanced in a state where the resin 41 remains in the gap 36 to solidify the resin 41. However, as shown in FIG. 1G-2, the resin 41 may protrude from the gap 36 and a tip resin portion (a third resin portion) 44 may be formed at a tip of the extended resin portion 42. The tip resin portion 44 is communicated with the extended resin portion 42 and is positioned on an opposite side of the frame-shaped resin portion 40 with respect to the extended resin portion 42.

Figure 1H:
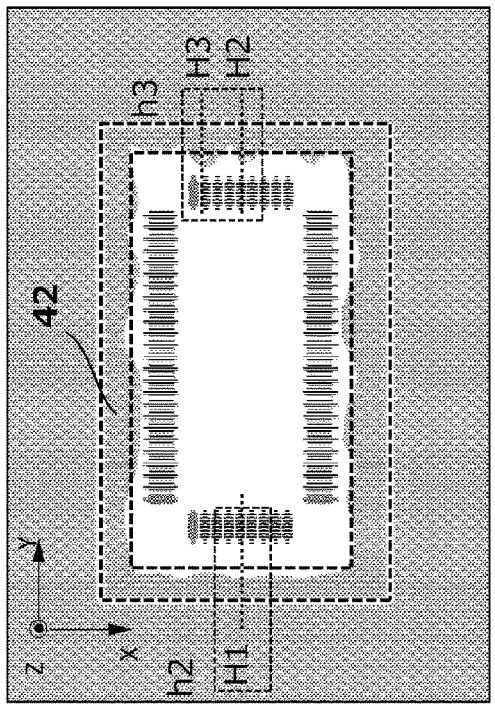
Figures 1, 1H:
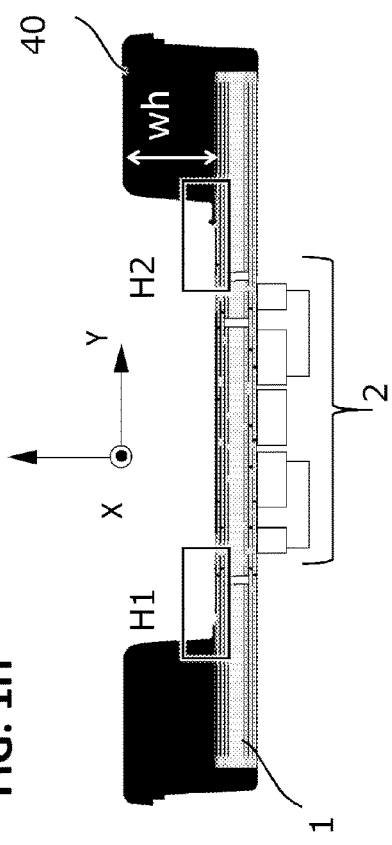
Figures 1, 1H, 2, 3:
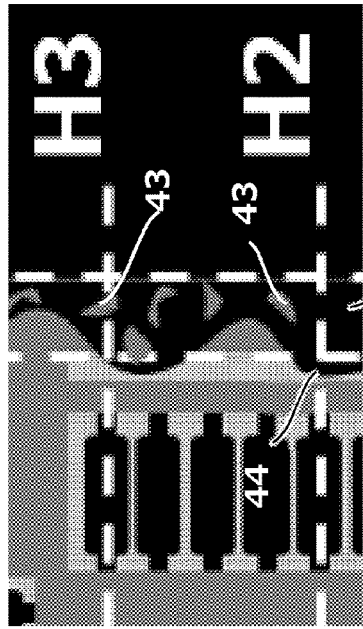
Figures 1, 1H, 2:
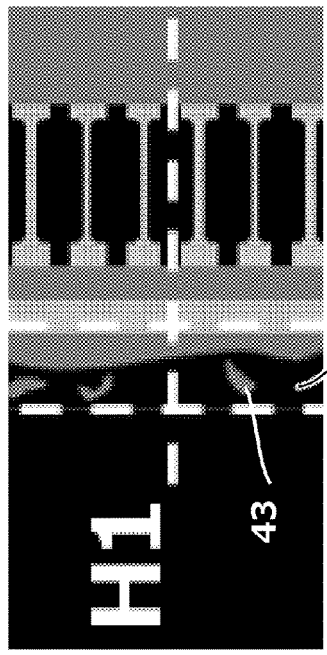

FIG. 1H represents a finished product of the package unit according to the first embodiment. FIG. 1H-1 is a Z-direction plan view, FIG. 1H-2 is an enlarged plan view of section h1, and FIG. 1H-3 is an enlarged plan view of section h2. FIG. 1H-4 is an enlarged cross-sectional view of section H1, FIG. 1H-5 is an enlarged cross-sectional view of section H2, and FIG. 1H-6 is an enlarged cross-sectional view of section H3.

The package unit is provided with the circuit board 1 and a resin member 4 which covers the circuit board 1 so as to surround a space above the central region 23 of the circuit board 1. The resin member 4 includes the frame-shaped resin portion 40 (a first resin portion) which is arranged above the conductor layer 14 of the peripheral region 25 of the circuit board 1 and which surrounds an outer periphery of the circuit board 1 and the extended resin portion 42 (a second resin portion) which is adjacent to an inner side of the frame-shaped resin portion 40. The extended resin portion 42 extends above the intermediate region 24 from the frame-shaped resin portion 40 toward a center of the circuit board 1. In addition, since the extended resin portion 42 is molded by the resin penetrating into the gap 36, a thickness (a height) thereof is approximately constant at the height h of the gap 36 and a value thereof is 0.5 μm or more and 500 μm or less and preferably ranges from 5 to 50 μm. The thickness of the extended resin portion 42 is, for example, less than half (½) of the thickness of the frame-shaped resin portion 40, more preferably less than ¼ and even more preferably less than 1/10 of the thickness of the frame-shaped resin portion 40. Since providing the extended resin portion 42 increases a contact area between the resin member 4 and the circuit board 1, adhesiveness between the resin member 4 and the circuit board 1 increases. Since providing the extended resin portion 42 enables the extended resin portion 42 to prevent moisture and the like from penetrating between the frame-shaped resin portion 40 and the circuit board 1, adhesiveness between the frame-shaped resin portion 40 and the circuit board 1 increases. By reducing the thickness of the extended resin portion 42, weight reduction of the resin member 4 can be achieved and, since an amount of use of the resin 41 can be reduced, there is also an advantage in cost reduction.

The thickness h of the extended resin portion 42 may be greater than a thickness t of an uppermost conductor layer 141 so that a height of an upper surface of the extended resin portion 42 is not affected by the thickness of the conductor layer 141 (h>t). The thickness h of the extended resin portion 42 may be two times or more of the thickness t of the uppermost conductor layer 141. A height of the upper surface of the extended resin portion 42 from the uppermost conductor layer 141 may be greater than the thickness of the conductor layer 141 and may be two times or more of the thickness of the uppermost conductor layer 141. For example, when a solder resist layer 11 with a thickness k is present under the extended resin portion 42, the height of the upper surface of the extended resin portion 42 from the uppermost conductor layer 141 is h+k which may satisfy h+k>t or, preferably, h+k>2×t. The thickness k of the solder resist layer 11 may be smaller than at least one of the thickness h and the thickness t. In addition, as shown from FIG. 1H-1 to FIG. 1H-3, an outer shape of an inner side of the extended resin portion 42 is an indeterminate shape or, in other words, a horizontal length w' is indeterminate. However, a maximum value of the horizontal length w' of the extended resin portion 42 is equal to or less than a width w of the gap 36 and, preferably, equal to or less than 1 mm. The horizontal length w' may be considered a length in a direction from the peripheral region 25 toward the central region 23 of a portion where an approximately constant height h continues in the resin portion. While the horizontal length w' of the portion is greater than the thickness h of the portion (w'>h) in a typical portion of the extended resin portion 42, the horizontal length w' of another portion of the extended resin portion 42 may be less than the thickness h of the other portion (w'<h).

As shown in the enlarged plan view of section h1 in FIG. 1H-2 and the enlarged plan view of section h2 in FIG. 1H-3, bubbles 43 are sparsely present inside the extended resin portion 42 but no bubbles are observed inside the frame-shaped resin portion 40. Bubbles are not present inside the frame-shaped resin portion 40 because, in the stage shown in FIG. 1G, pressure of 5 to 80 MPa is applied to the resin 41 inside the frame-shaped cavity 35 and gas contained inside the resin 41 dissolves into the resin 41. On the other hand, a pressure gradient such that pressure drops from a side of the frame-shaped cavity 35 toward a side of the central cavity 33 is present in the resin 41 having penetrated into the gap 36 of the frame-shaped narrow cavity 34. In the resin 41 having penetrated into the gap 36 of the frame-shaped narrow cavity 34, a portion close to the frame-shaped cavity 35 is subjected to pressure close to 5 to 80 MPa and gas contained inside the resin 41 has more or less been dissolved into the resin 41. However, the closer to the central cavity 33, the pressure on the resin 41 drops and, accordingly, solubility of the gas contained inside the resin 41 declines and the bubbles 43 are created. Pressure applied to the resin 41 in the vicinity of the central cavity is almost close to pressure of air inside the central cavity 33 and is at approximately 1 atmospheric pressure. In this manner, since bubbles remain in the extended resin portion 42, a surface on an opposite side to a surface of the extended resin portion 42 that comes into contact with the circuit board 1 has holes. Examples of the holes of the extended resin portion 42 include through-holes which penetrate the extended resin portion 42 and expose the circuit board 1 constituting a base and bottomed holes which are depressed with respect to a flat portion of the upper surface of the extended resin portion 42 and of which the extended resin portion 42 constitutes a bottom, and through-holes and bottomed holes may coexist.

The pressure gradient described above occurs because flow resistance with respect to the resin 41 flowing through the gap 36 is present within an appropriate range. Therefore, in order to advance a curing reaction of the resin 41 and solidify the resin 41 in a state where the resin 41 remains in the gap 36, a residual ratio of bubbles of the resin 41 having penetrated into the gap 36 is preferably higher than a residual ratio of bubbles of the resin 41 which is present inside the frame-shaped cavity 35. A preferable range is 30 times or higher. In addition, a residual ratio of bubbles contained in the extended resin portion 42 as shown in FIG. 1H is desirably 30 times or higher of a residual ratio of bubbles contained in the frame-shaped resin portion 40. Furthermore, desirably, the residual ratio of bubbles of the frame-shaped resin portion 40 is lower than 5%, more preferably lower than 3%, and even more preferably lower than 1% in order to increase a moisture-proof property of the package unit and to maintain mechanical strength of the package unit.

In this case, a residual ratio of bubbles is defined as an area ratio of bubbles in a cross-sectional surface or a side surface of a portion of which the residual ratio of bubbles is to be measured, raised to the 3/2 power. In order to measure a residual ratio of bubbles of a portion which contains a large amount of bubbles, it is defined that the area ratio described above is to be measured with respect to a surface where a considerable number of bubbles can be observed.

Next, a further desirable mode of the first embodiment will be described.

When the resin 41 deeply penetrates into the central cavity 33 at the stage shown in FIG. 1G and overlaps with the front surface electrode 12, since an electrical junction with the electronic device cannot be formed, the package ends up being defective. While such a defect may conceivably be avoided by arranging the front surface electrode 12 and the gap 36 with a greater distance therebetween, this ends up increasing a size of the package and is therefore not preferable.

In consideration thereof, as shown in the enlarged cross-sectional view of section C1 in FIG. 1C-2 and the enlarged cross-sectional view of section C2 in FIG. 1C-3, a height ch of an upper surface 31a of the central cavity 33 from the surface of the circuit board 1 is preferably set to 10 times or more with respect to the height h of the gap 36. Furthermore, the height ch is desirably smaller than a height wh (refer to FIG. 1H) of an upper surface 33b of the frame-shaped cavity 35 from the surface of the circuit board 1. Accordingly, even when the resin 41 does not remain in the gap 36 and penetrates into a part of the central cavity 33 and the tip resin portion 44 is formed, the possibility of the resin 41 reaching the front surface electrode 12 can be reduced. Therefore, the distance between the front surface electrode 12 and the gap 36 can be kept short and an effect of preventing the size of the package unit from increasing can be attained.

Furthermore, as shown in the enlarged cross-sectional view of section C1 in FIG. 1C-2 and the enlarged cross-sectional view of section C2 in FIG. 1C-3, a depressed portion 17 is preferably formed on a surface of the intermediate region 24 of the circuit board 1. The depressed portion 17 is formed at a position opposing the central cavity 33 among the surface of the intermediate region 24 of the circuit board 1 or, in other words, a frame-shaped region that is adjacent to the frame-shaped protruding portion 39 or the gap 36 in a state where the circuit board 1 is installed inside the mold 3. A height (a Z-direction position) of the front surface of the circuit board 1 in the portion where the depressed portion 17 is provided is lower than portions where the depressed portion 17 is not provided. The depressed portion 17 shown in FIGS. 1C-2 and 1C-3 represents an example in which the depressed portion 17 is formed by an opening provided in the solder resist layer 11. By providing the depressed portion 17 described above, even when the resin 41 penetrates into the central cavity 33 and the tip resin portion 44 is formed as shown in FIG. 1G, the resin 41 pools in the depressed portion 17 and the possibility of the resin 41 reaching the front surface electrode 12 can be reduced. Therefore, the distance between the front surface electrode 12 and the gap 36 can be kept short and an effect of preventing the size of the package unit from increasing can be attained.

A distance between the depressed portion 17 and the gap 36 preferably ranges from 0.05 to 1 mm. When the distance is shorter than this range, a deviation of a position of the circuit board 1 inside the cavity of the mold 3 causes the depressed portion 17 and the gap 36 to interfere with each other and makes it difficult to properly maintain the height h of the gap 36. In addition, when the distance is too long, the size of the package unit increases. In order to suppress a positional deviation of the circuit board 1 inside the cavity of the mold 3, a round hole and a U-shaped hole may be opened on the circuit board 1 and a pin (a protrusion) which fits into the round hole and the U-shaped hole may be provided on the mold 3.

Furthermore, a distance between the depressed portion 17 and the front surface electrode 12 also preferably ranges from 0.05 to 1 mm. When the distance is shorter than this range, depending on machining accuracy of the depressed portion 17, the depressed portion 17 and the front surface electrode 12 interfere with each other and make it difficult to properly maintain the length of the front surface electrode 12. For example, when the depressed portion 17 is a groove provided on the solder resist layer 11 by lithography, a positioning accuracy of a mask when performing the lithography is the machining accuracy of the depressed portion 17. In addition, when the distance between the depressed portion 17 and front surface electrode 12 is longer than 1 mm, the size of the package unit increases.

It is also preferable to set the distance between the depressed portion 17 and the front surface electrode 12 shorter than the distance between the depressed portion 17 and the gap 36. The distance between the depressed portion 17 and the gap 36 can be regarded as a distance between the depressed portion 17 and the extended resin portion 42 as well as a distance between the tip resin portion 44 and the extended resin portion 42. Adopting such a configuration enables the resin 41 to remain in the depressed portion 17 and reduces the possibility of the resin 41 reaching the front surface electrode while suppressing an increase in package unit size.

Furthermore, a width of the depressed portion 17 preferably ranges from 0.1 to 1 mm. When the width is shorter than 0.1 mm, a space for pooling the resin 41 becomes insufficient. When the width is longer than 1 mm, the size of the package unit increases.

In addition, a height th of the tip resin portion 44 shown in the enlarged cross-sectional view of section H2 in FIG. 1H-5 from the front surface of the circuit board 1 is preferably greater than a height h of the extended resin portion 42 from the circuit board 1. In other words, a thickness of the tip resin portion 44 is preferably greater than a thickness of the extended resin portion 42. Furthermore, preferably, a lower end position of the tip resin portion 44 is lower than a lower end position of the extended resin portion 42, and an upper end position of the tip resin portion 44 is higher than an upper end position of the extended resin portion 42. Adopting such a configuration enables the height th of the tip resin portion 44 to be set greater than the height h of the extended resin portion 42. The higher the height th of the tip resin portion 44, the larger the amount of the resin 41 that pools in the depressed portion 17 even when the resin 41 penetrates into the central cavity 33 as shown in an enlarged cross-sectional view of section G2 shown in FIG. 1G-2. This is preferable since the possibility that the resin 41 reaches the front surface electrode 12 can be reduced.

However, a situation where the height th of the tip resin portion 44 is higher than a height wh of the frame-shaped resin portion 40 shown in FIG. 1H is not preferable from the perspective of the package unit. In order to prevent an occurrence of such a situation, a height ch of the central cavity 33 shown in FIGS. 1C-2 and 1C-3 from the front surface of the circuit board 1 is preferably lower than the height wh of the frame-shaped cavity 35 from the front surface of the circuit board 1. In other words, the thickness of the tip resin portion 44 is preferably smaller than a thickness of the frame-shaped resin portion 40.

In addition, a filler may be added to the resin 41 as described earlier, and the filler preferably contains those of which a particle size is greater than the height h of the gap 36 shown in the enlarged cross-sectional view of section C1 in FIG. 1C-2 and the enlarged cross-sectional view of section C2 in FIG. 1C-3. The filler is preferably a silica filler. In addition, a volumetric content of the silica filler is preferably 80% or higher. This is because, by having the silica filler fill the gap 36 in the stage shown in FIG. 1G, since flowability of the resin 41 in the gap 36 drops, an amount of the resin 41 that penetrates into the central cavity 33 can be reduced. Since the height h of the gap 36 is equal to the thickness of the extended resin portion 42, the frame-shaped resin portion 40 has a filler of which a particle size is greater than the thickness of the extended resin portion 42.

Second Embodiment

Figure 3A:
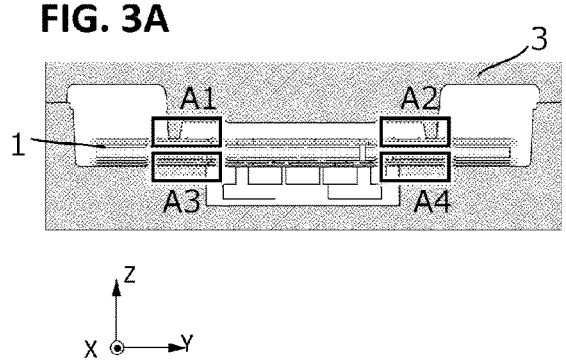
FIGS. 3A to 3F are diagrams illustrating a method of manufacturing a package unit according to a second embodiment.

A method of manufacturing a package unit according to a second embodiment of the present invention will be described. FIGS. 3A to 3F represent an example of the method of manufacturing a package unit according to the second embodiment. FIG. 3A is a diagram of a stage corresponding to FIG. 1C illustrating the first embodiment and shows a state where the circuit board 1 has been inserted into the mold 3. The mold 3 is the same as that of the first embodiment.

Figure 3B:
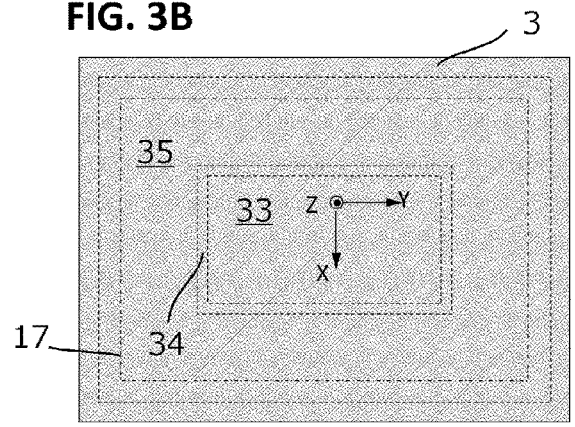
Figure 3C:
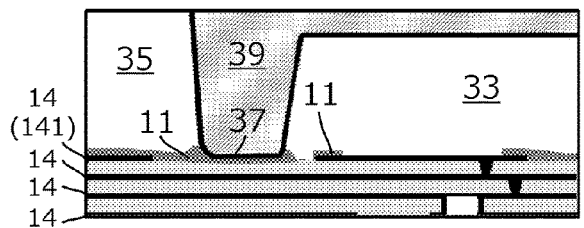

FIG. 3B is a Z-direction plan view (cross-sectional view) of the package unit, and FIGS. 3C to 3F are, respectively, enlarged cross-sectional views of sections A1 to A4.

The circuit board 1 is the same as that of the first embodiment with the exception of a total thickness of the circuit board 1 being 10% thicker than that of the first embodiment. As shown in the enlarged cross-sectional views of sections A1 to A4 shown in FIGS. 3C to 3F, the circuit board 1 has a plurality of conductor layers 14.

The upper mold 31 of the mold 3 has the frame-shaped protruding portion 39 in a portion between the central cavity 33 and the frame-shaped cavity 35. The circuit board 1 is sandwiched by a top frame-shaped plane 37 (FIGS. 3C and 3D) of the frame-shaped protruding portion 39 and an opposing plane 38 (FIGS. 3E and 3F) of the lower mold 32 that is provided so as to oppose the top frame-shaped plane 37.

FIGS. 4A to 4D show a creation stage of the circuit board 1 according to the second embodiment. These are diagrams showing enlargements of cross-sections taken at section D2 in the Z-direction plan view shown in FIG. 4A-1. The circuit board 1 shown in the diagrams is a so-called 2-4-2 build-up substrate, and step a represents a stage where two build-up layers have been respectively formed on both surfaces of a core layer.

Figures 1, 4A:
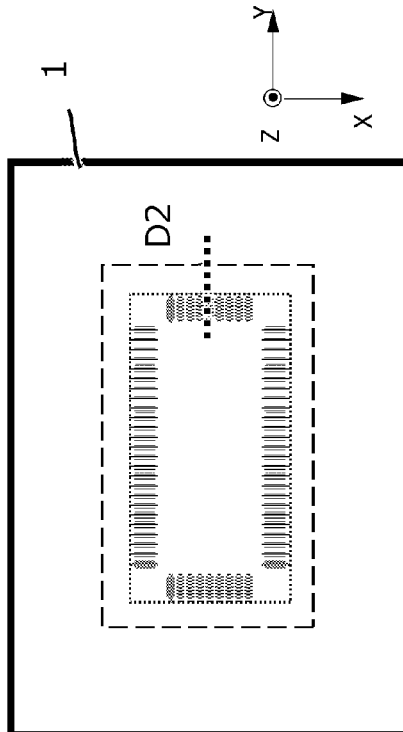
FIGS. 4A to 4G-3 are diagrams illustrating the method of manufacturing a package unit according to the second embodiment.
Figure 4A:
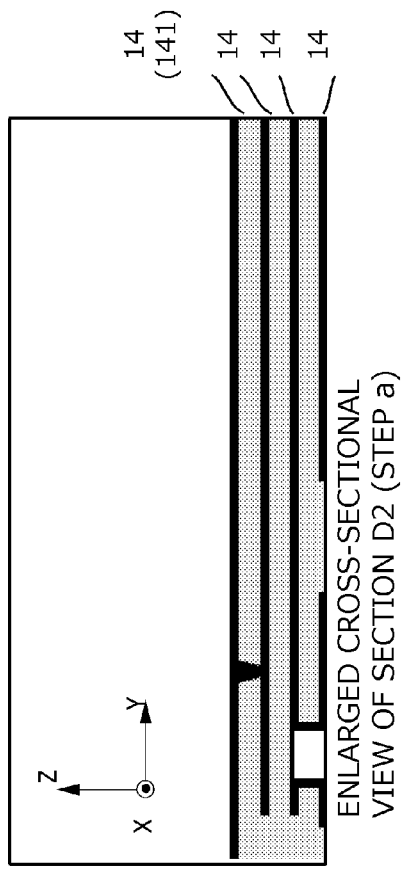
Figures 1, 4B:
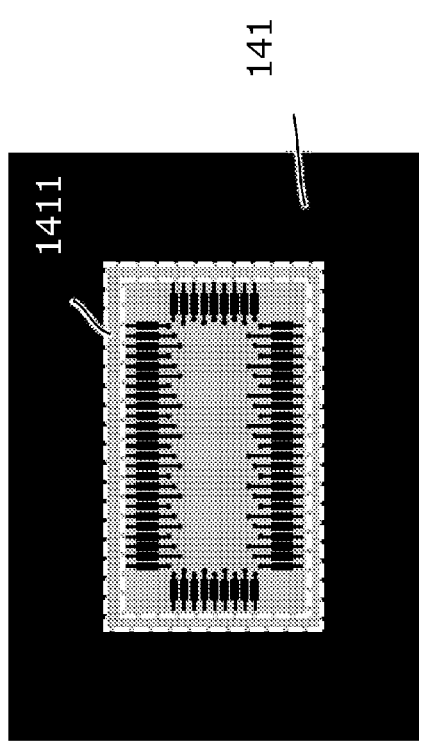
Figure 4B:
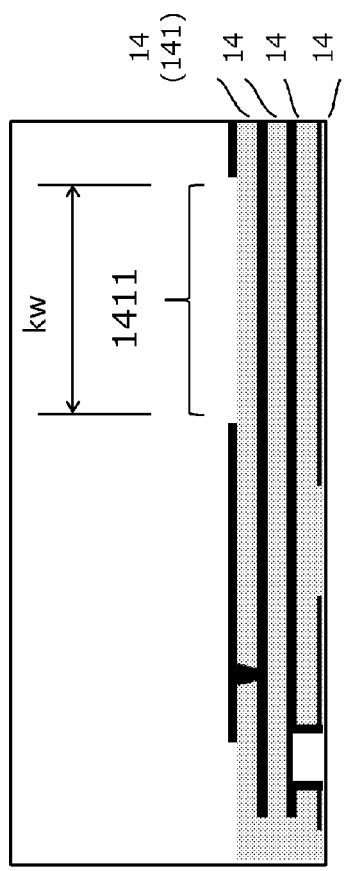

FIG. 4B shows a stage of step b. In step b, an uppermost conductor layer 141 formed in step a is patterned by lithography. The uppermost conductor layer 141 is a conductor layer 14 that comes into closest proximity to the top frame-shaped plane 37 in a state where the circuit board 1 is inserted into the mold 3 shown in FIG. 3A.

FIG. 4B-1 is a plan view of the circuit board 1 from the z direction in the stage of step b. As shown, the conductor layer 141 is provided with a frame-shaped opening 1411 in a portion sandwiched between two rectangular dashed lines. A region provided with the frame-shaped opening 1411 may be provided in the following step in a region including a position that overlaps with the frame-shaped protruding portion 39 and may be provided in, for example, the entire intermediate region 24 (FIG. 8A) between the central region 23 and the peripheral region 25 on the circuit board 1. FIG.

4B also shows the frame-shaped opening 1411. The frame-shaped opening 1411 is portion in which at least the uppermost conductor layer 141 has been removed in a frame shape by lithography. The frame-shaped opening 1411 can also be described as a frame-shaped depressed portion. As is apparent from a comparison between FIG. 4B and FIG. 3D, the frame-shaped opening 1411 is provided in a portion where the top frame-shaped plane 37 of the mold 3 and the conductor layer 141 oppose each other. The frame-shaped opening 1411 is provided in this portion and a width kw thereof is greater than a width w of the top frame-shaped plane 37.

Figure 4C:
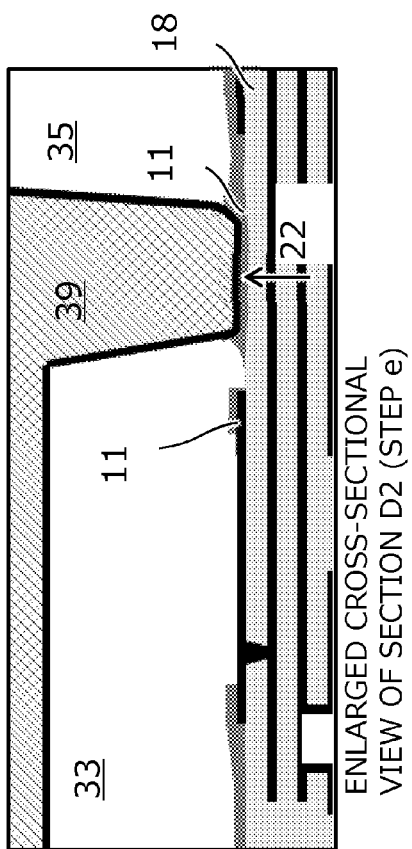

FIG. 4C shows a stage of step c. In step c, the solder resist layer 11 is formed on a front surface of the circuit board 1. The solder resist layer 11 is formed by applying a liquid resist using a known roll coater, spin coater, spray coater, or the like and solidifying the liquid resist by applying heat or UV. In the case of a liquid solder resist, even if a thickness of a portion where the conductor layer 141 is present and a thickness of a portion (the frame-shaped opening 1411) where the conductor layer 141 is not present are the same at a time point where the liquid resist is applied, thicknesses of the solder resist layer 11 after curing differ. Specifically, a thickness tk of an opening portion where the conductor layer 141 is not present becomes thicker by 10 to 30% than a thickness td of a portion where the conductor layer 141 is present. This is because, even when the thickness is the same at a time point where the liquid resist is applied, the liquid resist flows into the portion (the opening) where the conductor layer 141 is not present from the portion where the conductor layer 141 is present before solidifying and a leveling action takes place in which a liquid surface moves to even itself out.

Figure 4E:
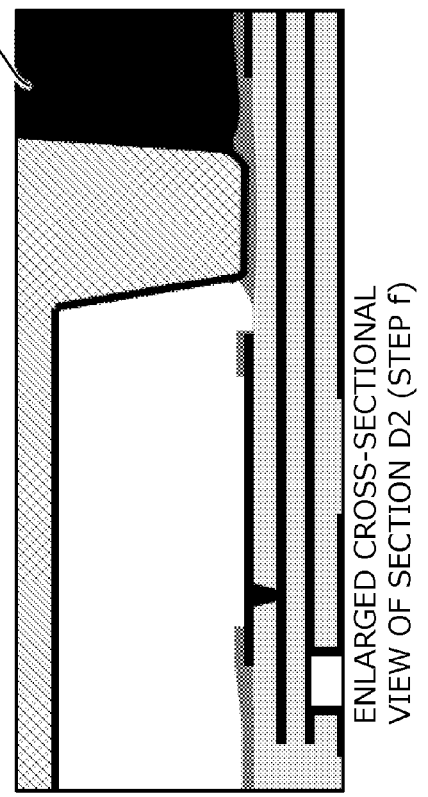
Figure 4D:
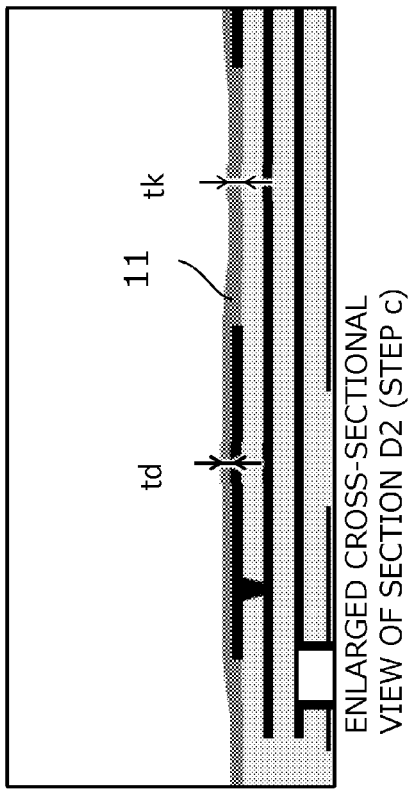

FIG. 4D shows a stage of step d. In step d, exposure and a development process are performed on the cured solder resist layer 11 to open an opening in a desired portion of the circuit board 1. As shown in FIG. 4D, the solder resist layer 11 remains in at least a part of the frame-shaped opening 1411. As described later, the solder resist layer 11 is preferably formed in a portion that is sandwiched by the frame-shaped protruding portion 39 of the mold 3. In addition, as shown in FIG. 4D, the solder resist layer 11 is formed so as to also remain in a portion other than the frame-shaped opening 1411 (other than the frame-shaped depressed portion) among the front surface of the circuit board 1.

Figure 3D:
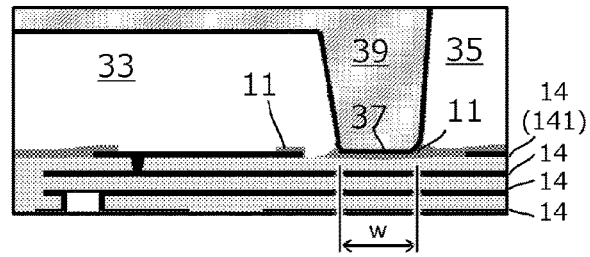
Figure 3E:
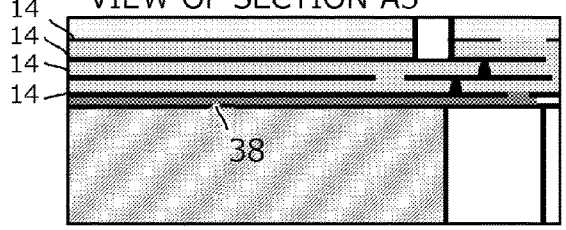
Figure 3F:
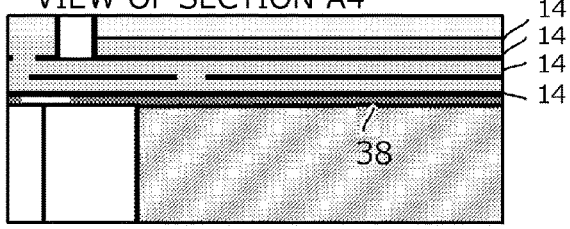

FIG. 4E is a state diagram which shows the circuit board 1 being inserted into the mold 3 and sandwiched by the top frame-shaped plane 37 and the opposing plane 38 and which is a same diagram as FIG. 3D. In the circuit board 1, the central region 23 opposes the central cavity 33, the peripheral region 25 opposes the frame-shaped cavity 35, and the frame-shaped narrow cavity 34 (the frame-shaped protruding portion 39) opposes the intermediate region 24. The frame-shaped protruding portion 39 comes into contact with (overlaps with) the solder resist layer 11 in the intermediate region 24 of the circuit board 1. The solder resist layer 11 that overlaps with the frame-shaped protruding portion 39 is the solder resist layer provided in the frame-shaped opening 1411 or, in other words, the solder resist layer positioned between the conductor layer 14 of the central region 23 and the conductor layer 14 of the peripheral region 25.

At this stage, the frame-shaped protruding portion 39 bites into the solder resist layer 11 and causes the solder resist layer 11 to deform and depress. In other words, a surface (a surface on an opposite side to the circuit board 1) of the solder resist layer 11 in the intermediate region 24 is a depressed surface. In addition, a slight depression has also occurred in the prepreg layer 18 in a portion indicated by an arrow 22. However, the degree of depression can be kept within a range where the strength of a package does not become insufficient or moisture resistance of the package does not drop. This is because a thickness of the resist layer 11 being formed in the frame-shaped opening 1411 which is a contact region with the frame-shaped protruding portion 39 is set thicker by 10 to 30% than a portion that covers the conductor layer 14. The resist layer 11 effectively absorbs stress applied from the frame-shaped protruding portion 39 and deforms, and prevents damage to the prepreg layer 18 and the conductor layer 14.

Figure 4F:
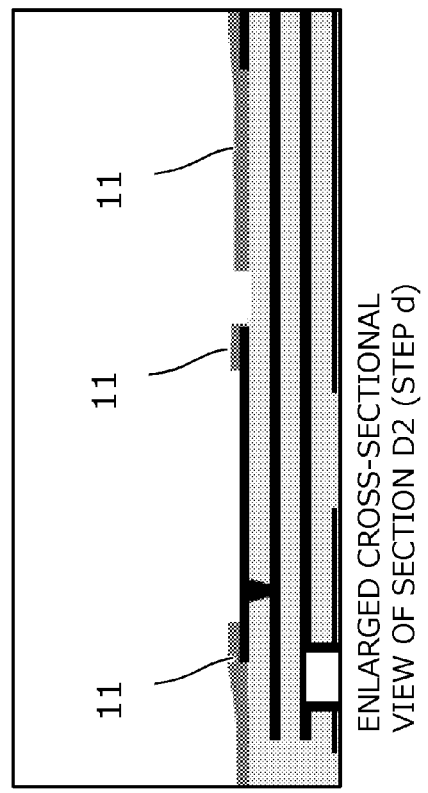

FIG. 4F shows a stage where the resin 41 has flowed into a part of the cavity of the mold 3 or, in other words, the frame-shaped cavity 35.

Figures 1, 4G:
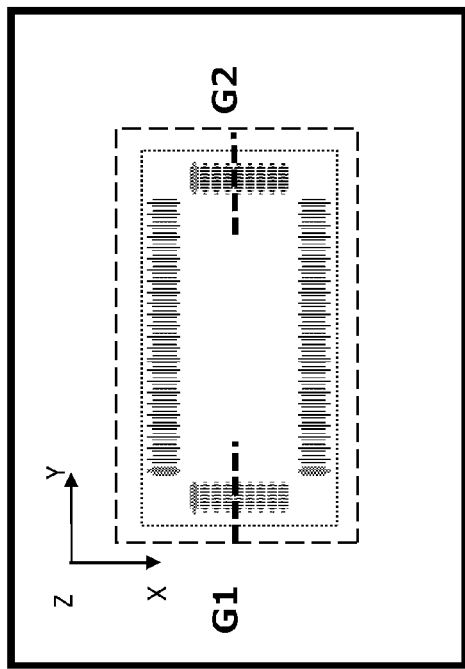
Figure 4G:
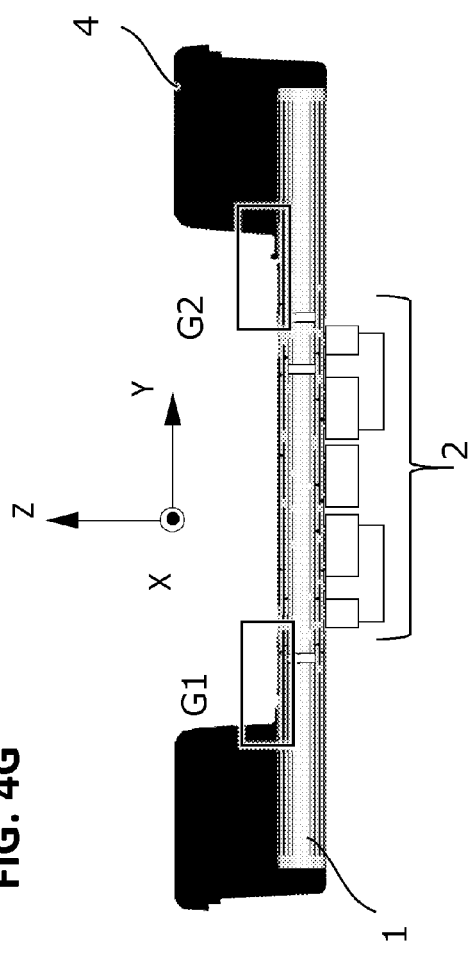
Figures 3, 4G:
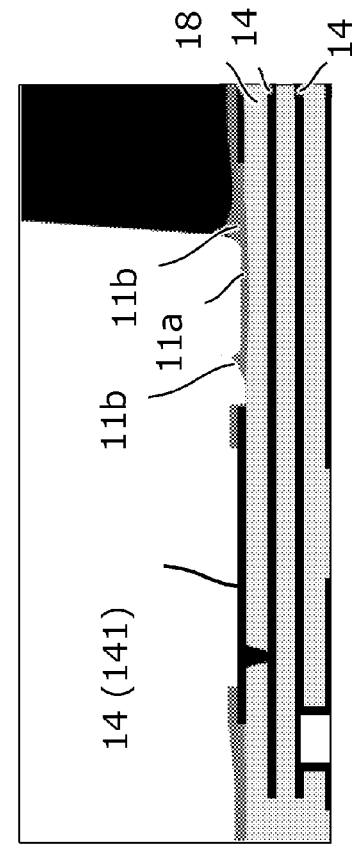
Figures 2, 4G:
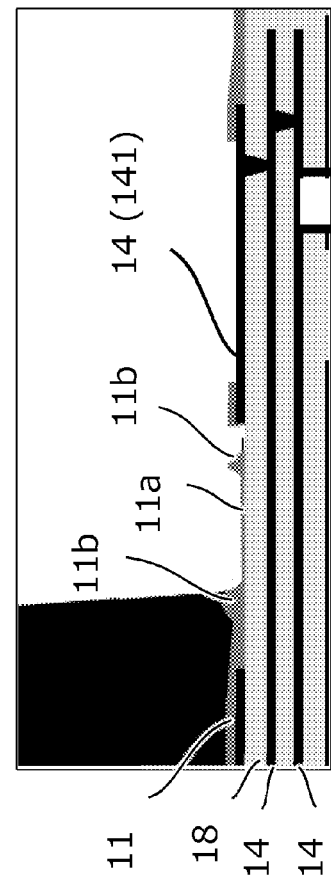

FIG. 4G is an overall completed view of a package according to the second embodiment. FIG. 4G-1 is a Z-direction plan view thereof, and FIG. 4G-2 and FIG. 4G-3 are, respectively, enlarged cross-sectional views of section G1 and section G2 in FIG. 4G-1.

The completed package is constituted by the circuit board 1 including a plurality of conductor layers 14 and the frame-shaped resin portion 40 provided so as to surround an outer periphery of the circuit board 1. The uppermost conductor layer 141 among the plurality of conductor layers 14 is removed along an entire inner periphery of the frame-shaped resin portion 40 to form the frame-shaped opening (the frame-shaped depressed portion) 1411. In addition, the entire frame-shaped opening 1411 and at least a part of the uppermost conductor layer 141 are covered by the solder resist layer 11 having been created by curing a liquid resist. As described earlier, a central portion of the frame-shaped opening 1411 is sandwiched by the frame-shaped protruding portion 39 of the mold 3. By being sandwiched, the solder resist layer 11 deforms and a thickness of a solder resist layer 11a in a portion being sandwiched by the frame-shaped protruding portion 39 (the central portion of the frame-shaped opening 1411) becomes thinner than a thickness of a solder resist layer 11b in a peripheral portion. A slight depression has also occurred in the prepreg layer 18 in the portion indicated by the arrow 22. However, the degree of depression can be kept within a range where the strength of a package does not become insufficient or moisture resistance of the package does not drop.

Using a solder resist with a low modulus of elasticity is effective in also preventing an occurrence of a depression of the prepreg layer 18. In particular, a solder resist having a modulus of elasticity of around 2 to 4 GPa is preferable. An example of a liquid resist with relatively low elasticity is PSR-4000 AUS308 manufactured by TAIYO INK MFG. CO., LTD.

FIGS. 5A to 5D are diagrams showing a preferable example of the second embodiment. FIGS. 5A to 5D are enlarged cross-sectional views of section B2 in a Z-direction plan view in FIG. 5A-1. Hereinafter, differences from the example shown in FIGS. 4A to 4G will be mainly described with reference to the drawings.

Processes up to step d are similar to those described above. As a step shown in FIG. 5A following step d (FIG. 4D), a solder resist layer 19 is once again formed on the circuit board 1.

Figures 1, 5A:
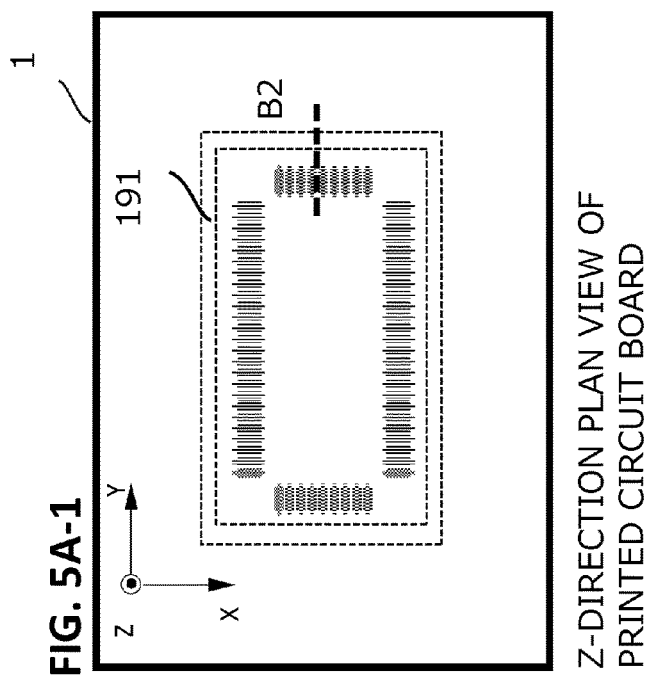
FIGS. 5A to 5D are diagrams illustrating the method of manufacturing a package unit according to the second embodiment.
Figure 5A:
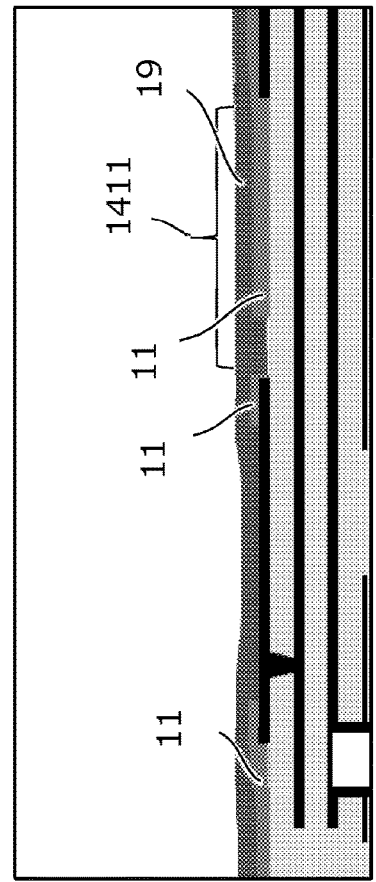
Figure 5B:
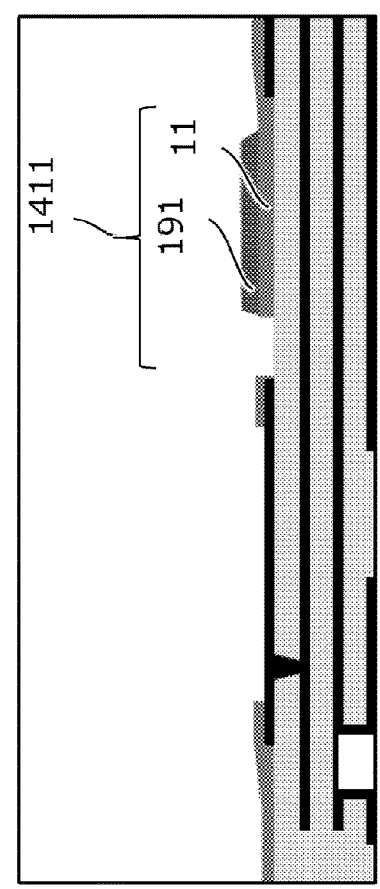

Next, as shown in FIG. 5B, the solder resist layer 19 is patterned by lithography and a solder resist layer 191 is formed on the frame-shaped opening 1411 created in the uppermost conductor layer 141. In this manner, two solder resist layers 11 and 191 are formed in the frame-shaped opening 1411.

Figure 5D:
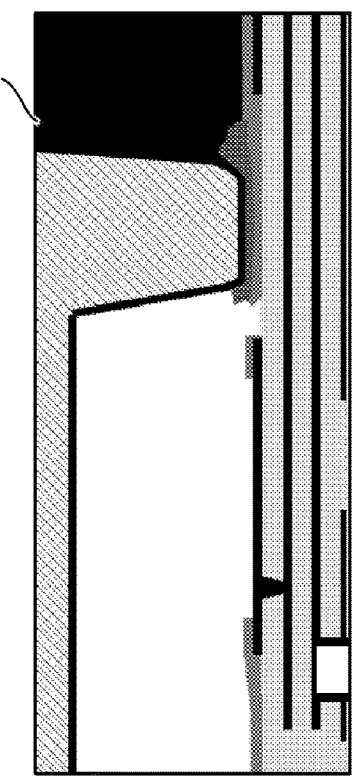
Figure 5C:
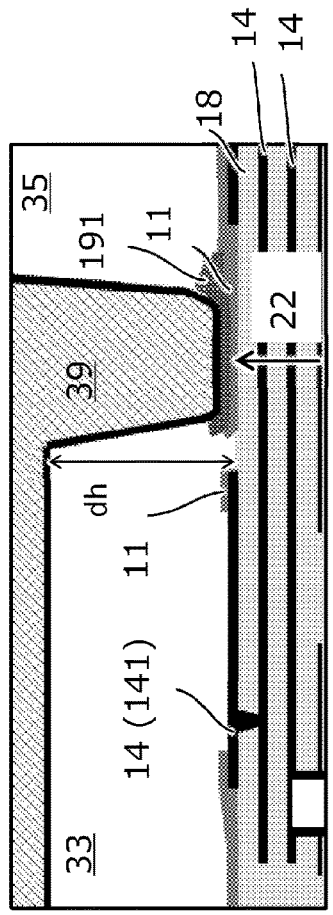

Next, as shown in FIG. 5C, the circuit board 1 is inserted to a mold of which a height dh of the central cavity 33 differs from that of the mold 3 according to the first embodiment. The height dh of the central cavity 33 can be regarded as a length of the frame-shaped protruding portion 39. In the present embodiment, the height dh of the central cavity 33 can be set 20 to 30 µm shorter than the height ch shown in FIG. 1C-3. Accordingly, an effect is produced in which, although the solder resist layer 11 and the solder resist layer 191 deform, the solder resist layer 11 and the solder resist layer 191 effectively absorb stress applied from the frame-shaped protruding portion 39 and prevent damage to the portion indicated by the arrow 22 of the prepreg layer 18 and to the conductor layer 14. Finally, as shown in FIG. 5D, the resin 41 is poured into a part of the cavity of the mold 3 or, in other words, the frame-shaped cavity 35 to mold the tip resin portion 44.

Comparative Mode

Figures 1, 6A:
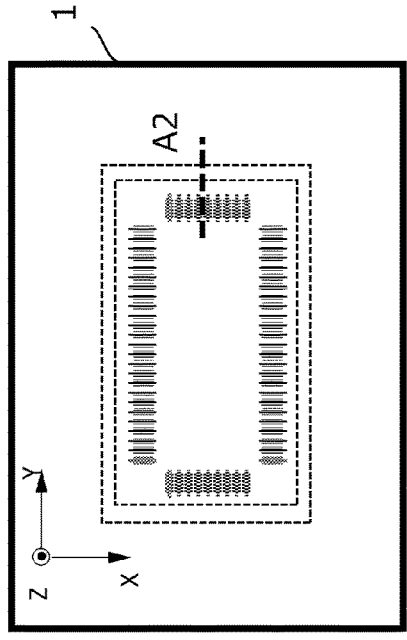
FIGS. 6A to 6C are diagrams illustrating a method of manufacturing a package unit according to a comparative mode.
Figure 6A:
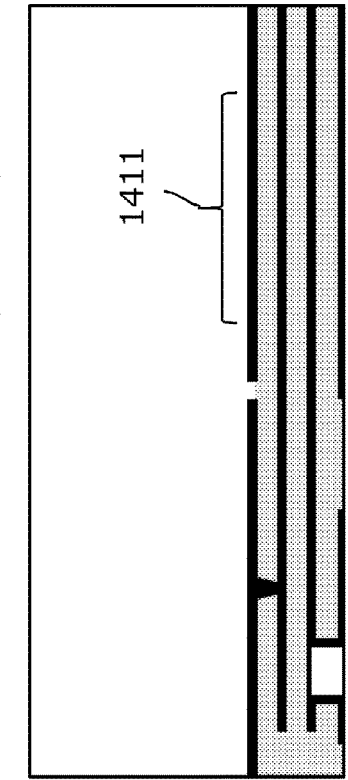
Figure 6B:
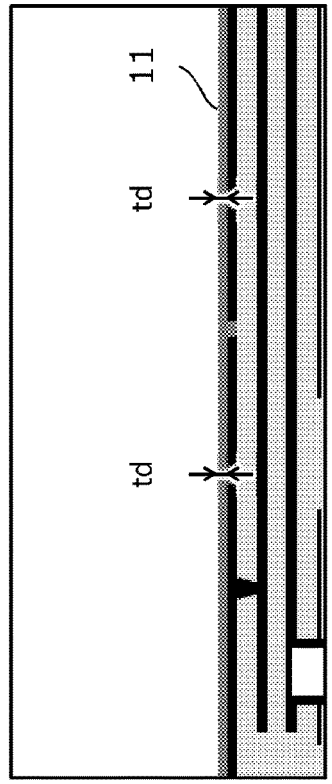

Next, a comparative mode will be described with reference to FIGS. 6A to 6C. These are diagrams showing enlargements of cross-sections taken at section A2 in the Z-direction plan view shown in FIG. 6A-1.

In the present comparative mode, instead of providing the frame-shaped opening 1411 on the uppermost conductor layer 141 of the circuit board 1 according to the second embodiment, a molding process is performed by sandwiching the circuit board 1 with the mold 3. FIG. 6A shows that an opening is not provided in the portion where the frame-shaped opening 1411 had been provided in the step shown in FIG. 4B. Furthermore, the solder resist layer 11 is formed in FIG. 6B. In this case, unlike in FIG. 4C, since the frame-shaped opening 1411 is absent, a leveling effect of a liquid solder resist is not produced and the solder resist layer 11 has a uniform thickness of td.

Figure 6C:
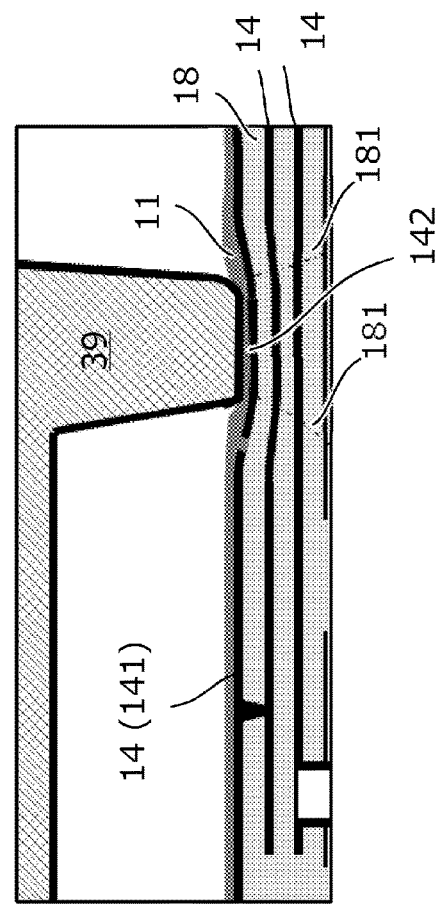

Furthermore, FIG. 6C shows a state where the circuit board 1 is inserted into the same mold 3 as the first embodiment. As shown, in the present example, since insufficient thickness of the solder resist layer 11 and the absence of the frame-shaped opening 1411 on the uppermost conductor layer 141 causes stress applied from the frame-shaped protruding portion 39 to reach a lower part of the circuit board 1, a crack 181 is likely to occur in the prepreg layer 18. In addition, a crack 142 is also likely to occur in the uppermost conductor layer 141 and is therefore not preferable.

Third Embodiment

Figure 7A:
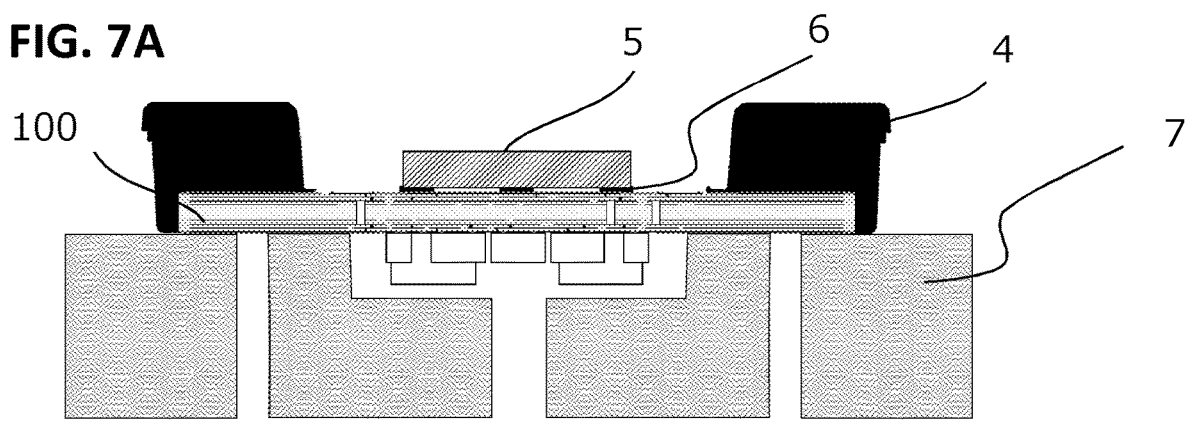
FIGS. 7A to 7C are diagrams illustrating an electronic module using a package unit.
Figure 7B:
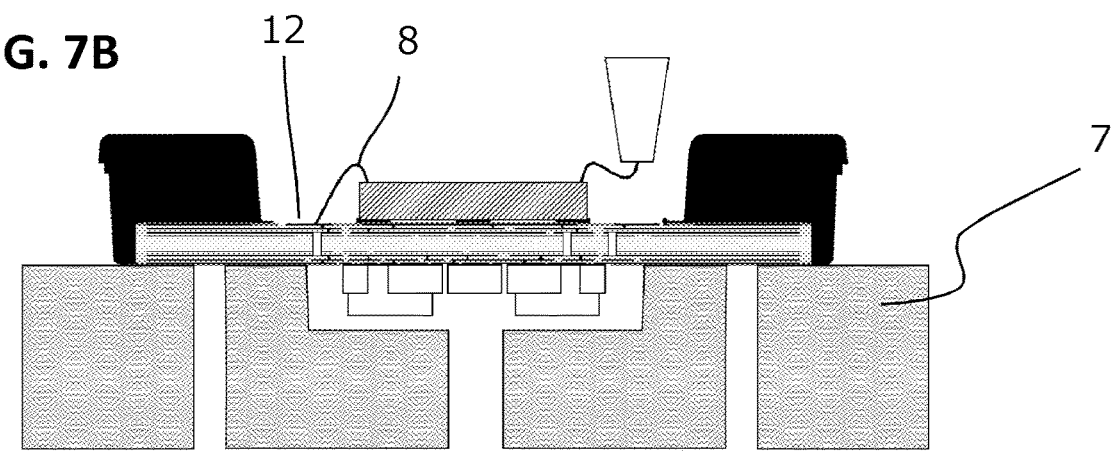
Figure 7C:
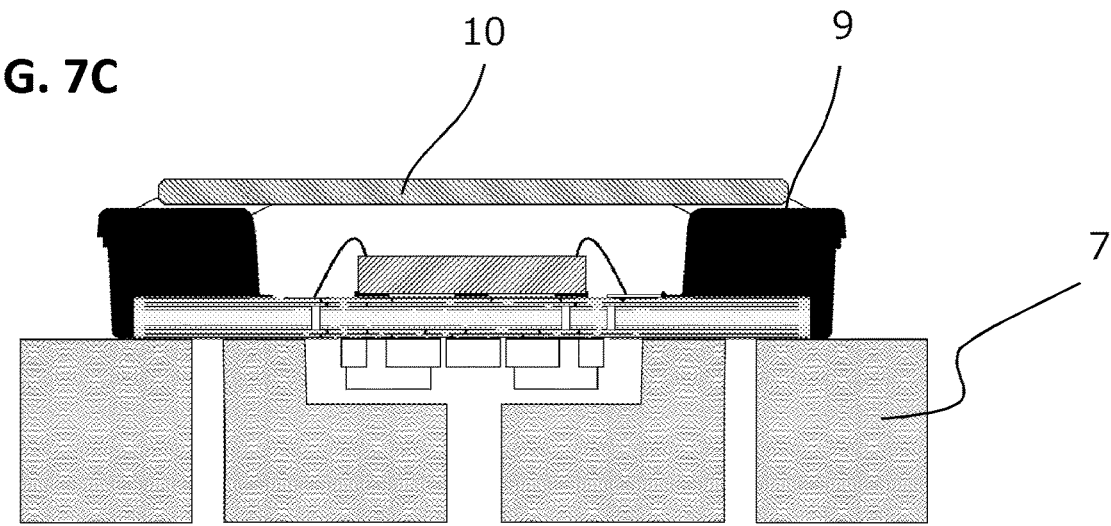

An electronic module using the package unit according to the first embodiment or the second embodiment will be described with reference to FIGS. 7A to 7C. The electronic module is configured to include an electronic device mounted on a circuit board of a package and a lid portion that covers the package. When the electronic device is an imaging device, the electronic module is an imaging module, and when the electronic device is a display device, the electronic module is a display module. In order to ensure that the electronic device can be stored in the package unit, a thickness (a height) of the electronic device is smaller than a thickness wh of the frame-shaped resin portion 40 and greater than a thickness h of the extended resin portion 42. By reducing the thickness of the extended resin portion 42, a side surface of the resin member 4 (an inner surface of the frame-shaped resin portion 40) which faces a space surrounded by the resin member 4 can be separated from the electronic device 5. When the electronic device is a display device or an imaging device, since reflection of light by the side surface of the resin member 4 can be suppressed, a decline in image quality due to the reflected light can be suppressed. By making the thickness of the extended resin portion 42 smaller than a thickness of the electronic device, an optical effect of the extended resin portion 42 on a surface (an upper surface) of the electronic device on an opposite side to the circuit board 1 can be reduced as much as possible.

A method of manufacturing the electronic module is as follows. First, as shown in FIG. 7A, a package unit 100 is fixed to a known suction stage 7 and the electronic device 5 such as an imaging device is bonded and fixed to a central portion of the package unit 100 via a known adhesive 6. By reducing the thickness of the extended resin portion 42, a volume of a space surrounded by the resin member 4 can be increased. Accordingly, since a work space can be widened when arranging the electronic device 5 in the space surrounded by the resin member 4, the electronic device 5 can be readily arranged. Next, using a known wire 8 as shown in FIG. 7B, an electrode pad of the electronic device 5 and the front surface electrode 12 of the package unit 100 are connected to each other by a known wire-bonding method. A side surface of the resin member 4 (an inner surface of the frame-shaped resin portion 40) can be separated from the electronic device 5. Accordingly, the resin member 4 can be prevented from interfering with a capillary when performing the wire-bonding. Finally, a known translucent lid 10 is bonded and fixed to the package unit 100 via a known adhesive to complete an imaging element module. A distance between the translucent lid 10 and the electronic device 5 can be controlled by a thickness of the frame-shaped resin portion 40. At this point, by sufficiently reducing the thickness of the extended resin portion 42, the extended resin portion 42 is prevented from unnecessarily affecting the distance between the translucent lid 10 and the electronic device 5.

Such an electronic module can be applied to various equipment. While applicable equipment are not particularly limited, examples thereof include electronic information equipment (electronic equipment, information equipment) such as a smartphone, a camera, and a personal computer. Alternatively, examples of equipment to which the present invention can be applied include communication equipment for performing radio communication or the like, office equipment such as a copier and a scanner, and transportation equipment such as an automobile, a ship, and an aircraft. Alternatively, examples of equipment to which the present invention can be applied include industrial equipment such as a robot, analyzing equipment which use energy beams (light, electron beams, or radio waves), and medical equipment such as an endoscope and radiological equipment. In an equipment to which the present invention is applied, the circuit board of the electronic module according to the embodiment described above is connected to other parts of the equipment. While functions of the other parts of the equipment to which the circuit board is to be connected can be appropriately set depending on functions of the electronic module, examples of the parts include a part for controlling or driving the electronic module and a part for processing signals for communicating with the electronic module. Adopting the electronic module according to the present embodiment in an equipment is advantageous in terms of improving durability and reliability of the equipment as well as downsizing and weight reduction of the equipment. Examples of equipment to be mounted with an imaging module include various equipment such as a digital still camera, a digital camcorder, a monitoring camera, a copier, a facsimile, a mobile phone, a vehicle-mounted camera, an observation satellite, and a camera for medical use. Such equipment include an optical system, an electronic equipment, and a processing apparatus. An electronic equipment that is an imaging equipment photoelectrically converts an object image formed by the optical system and outputs the photoelectrically converted object image as an image signal or a focus detection signal. The processing apparatus performs image processing, an equipment control process, and the like on the basis of a signal output from the imaging equipment. Examples of equipment control include control of a moving body such as a vehicle, a ship, or an aircraft.

Figure 9:
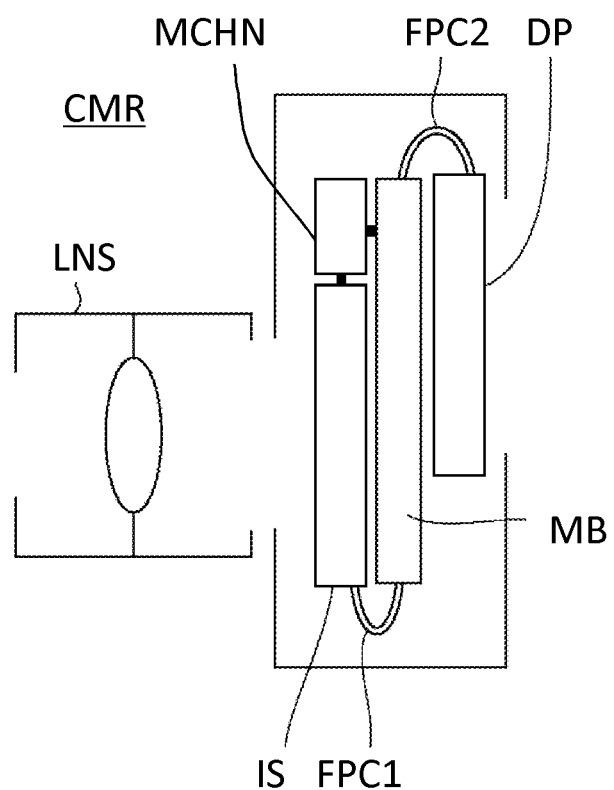
FIG. 9 is a diagram illustrating an example of an equipment using an electronic module according to an embodiment.

FIG. 9 illustrates a camera CMR as an example of an equipment to which an electronic module is applied. The camera CMR may include an imaging module IS, an electric module MB, and a display module DP. The electric module MB is a component for controlling or supplying power to the imaging module IS and/or the display module DP and a component for processing signals used to communicate with the imaging module IS and/or the display module DP. The electric module MB may be connected to a circuit board of the electric module via flexible wiring. In the camera CMR, the display module DP may constitute an electronic view finder (EVF) or may constitute a touch panel. In addition, the camera CMR may include a lens LNS that is attachable to and detachable from a camera body or a lens LNS that is fixed to the camera body. The camera CMR may include a machine module MCHN for moving the imaging module IS inside the camera body. Any of the electronic modules according to the embodiments described above may be any of the imaging module IS and the display module DP. The imaging module IS is connected to the electric module MB via a flexible printed wiring board FPC1 which is connected to the imaging module IS. The display module DP is connected to the electric module MB via a flexible printed wiring board FPC2 which is connected to the display module DP. The flexible printed wiring boards may be connected to the connector 221 shown in FIGS. 8A and 8B. In the camera CMR, a camera shake prevention (anti-vibration) function can be realized by moving (displacing) the imaging module IS that corresponds to the electronic module by the machine module MCHN. Since the imaging module IS to which the electronic module according to the present embodiment is applied attains weight reduction, an increased movement speed of the imaging module IS and a reduced load on the machine module MCHN for movement can be realized. Since the electronic module according to the present embodiment has a highly reliable package unit, durability of an equipment that involves such movements of the electronic module can be increased.

First Example

Hereinafter, an example of the present invention will be described. The package unit 100 was fabricated by the method of manufacturing a package unit shown in FIG. 1A to 1H using the mold 3 shown in FIG. 2A.

A resin substrate was used as the circuit board 1 and configured as a so-called 2-4-2 build-up substrate. The conductor layer 14 was created using 18 μm-thick copper foil.

The core layer and the build-up layer include a prepreg layer 18. The prepreg layer 18 is configured such that fibers woven or knitted into a cloth pattern are impregnated with a resin. Epoxy containing an insulating filler was used as the resin.

In addition, front and rear surfaces of the circuit board 1 were provided with the solder resist layer 11. The solder resist layer 11 was formed by a method involving applying a liquid resist using a roll coater, curing the liquid resist by UV and heat, and subsequently performing patterning in a similar manner.

The electronic components 2 were soldered and connected to the rear surface of the circuit board 1 as shown in FIG. 1B by a known surface mounting method. Flux cleaning was performed using a known cleaner and a known cleaning solution.

The used electronic components include a ceramic capacitor, an organic capacitor made of tantalum or the like, a chip resistor, a B-to-B connector, a regulator IC for a power supply, a common-mode connector coil, a temperature measurement IC, and an EPROM.

FIGS. 2A to 2C exclusively illustrate the mold 3 used in the present example. The mold 3 is constituted by the upper mold 31 and the lower mold 32. FIG. 2A shows a state where the mold 3 is opened and FIG. 2B shows a state where the mold 3 is closed. In the state where the mold 3 is closed, a cavity is prepared inside the mold. As shown in FIG. 2B, the cavity is constituted by the central cavity 33, the frame-shaped narrow cavity 34 provided on an outer periphery of the central cavity 33, and the frame-shaped cavity 35 provided on an outer periphery of the frame-shaped narrow cavity 34. In addition, the mold 3 is provided with a gate (not illustrated) for injecting resin in a direction indicated by the arrow 201 in FIG. 2B and an air vent (not illustrated) for releasing air having been forced out by resin in a direction indicated by the arrow 202.

FIG. 1C shows a state where the circuit board 1 according to the present example is inserted into the mold 3. As shown in the Z-direction plan view of FIG. 1C-1, the entire outer periphery 21 of the circuit board 1 is included inside the frame-shaped cavity 35 in this state. Furthermore, the gap 36 is provided between an inner surface of the frame-shaped narrow cavity 34 and the front surface of the circuit board 1. In this manner, in the present example, the circuit board 1 is not clamped by the mold 3 in a state where the circuit board 1 is inserted into the mold 3. Therefore, an occurrence of damages such as a crack in the circuit board 1 and a deformation or a fracture of the conductor layers 14 which have been problems in the past can be prevented.

Transfer molding is used in the present example. A thermosetting resin is used. Resin materials with powder resin as a main component and including a curing agent, a releasing agent, a coupling agent, and a flame retardant were shaped into a cylindrical tablet and the resin tablet was placed inside a pot to be preheated. In a state where the resin had been melted by the preheating and viscosity had dropped to 30 Pa·s, the resin 41 was extruded from the pot with a plunger and injected into the cavity via a cull, a runner, and a gate. The mold 3 was preheated in advance to a temperature of 145° C. which is higher than a glass-transition temperature of the resin 41 of 140° C.

From FIG. 1D to FIG. 1E, conditions were selected such that the resin 41 injected from the gate advances so as to fill the frame-shaped cavity 35. Air in the portions to which the resin enters was adjusted to be discharged from the air vent (not illustrated). At this stage, pressure of the resin 41 was relatively low at 4 MPa. Once the stage shown in FIG. 1F arrived, the pressure of the resin 41 started to rise and, eventually, filling was completed in the stage shown in FIG. 1G at pressure of 30 MPa.

The height h of the gap 36 shown in the enlarged cross-sectional view of section E in FIG. 1E-1 was adjusted to 30 μm. In addition, the width w of the frame-shaped narrow cavity 34 shown in the enlarged cross-sectional view of section E in FIG. 1E-1 was similarly set to 0.3 mm. By adopting such conditions, it was possible to more or less keep the resin 41 inside the gap 36 as shown in the enlarged cross-sectional view of section G1 in FIG. 1G-1 when viscosity of the resin 41 was 30 Pa·s as described earlier in the final stage shown in FIG. 1G. This is because a flow resistance of the gap 36 with respect to the resin 41 was sufficiently high and, therefore, a flow rate of the resin 41 to the gap 36 was sufficiently slowed, and it was possible to advance a curing reaction of the resin 41 in a state where the resin 41 remains in the gap 36 to solidify the resin 41.

FIG. 1H represents a finished product of the package unit according to the present example. The finished product is provided with the circuit board 1, the frame-shaped resin portion 40 which surrounds an outer periphery of the circuit board 1, and the extended resin portion 42 which is adjacent to an inner side of the frame-shaped resin portion 40. As shown from FIG. 1H-1 to FIG. 1H-3, an outer shape of an inner side of the extended resin portion 42 is an indeterminate shape. In addition, a height h of a narrow resin mold portion shown in the enlarged cross-sectional views in FIGS. 1H-4 to 1H-6 corresponds to the height h of the gap 36 shown in the enlarged cross-sectional view of section E shown in FIG. 1E-1 and had a value of 30 μm.

As shown in the enlarged plan views in FIGS. 1H-2 and 1H-3, bubbles 43 are sparsely present inside the extended resin portion 42 but no bubbles are observed inside the frame-shaped resin portion 40. Bubbles are not present inside the frame-shaped resin portion 40 because, in the stage shown in FIG. 1G, pressure of 30 MPa is applied to the resin 41 inside the frame-shaped cavity 35 and gas contained inside the resin 41 is dissolved in the resin 41. On the other hand, a pressure gradient such that pressure drops from a side of the frame-shaped cavity 35 toward a side of the central cavity 33 is present in the resin 41 having penetrated into the gap 36 of the frame-shaped narrow cavity 34. In the resin 41 having penetrated into the gap 36 of the frame-shaped narrow cavity 34, a portion close to the frame-shaped cavity 35 is subjected to pressure close to 30 MPa and gas contained inside the resin 41 has more or less been dissolved in the resin 41. However, the closer to the central cavity, the pressure on the resin 41 drops and, accordingly, solubility of the gas contained inside the resin 41 declines and the bubbles 43 are created. Pressure applied to the resin 41 in the vicinity of the central cavity was almost close to pressure of air inside the central cavity 33 and was at approximately 1 atmospheric pressure.

The pressure gradient described above occurs because flow resistance with respect to the resin 41 flowing through the gap 36 is present within an appropriate range. A comparison between a residual ratio of bubbles of the resin 41 having penetrated into the gap 36 and a residual ratio of bubbles of the resin 41 which is present inside the frame-shaped cavity 35 yielded a result of 55 times. Accordingly, it was possible to advance a curing reaction of the resin 41 in a state where the resin 41 remains in the gap 36 to solidify the resin 41. In addition, a residual ratio of bubbles contained in the extended resin portion 42 as shown in FIG. 1H was also 60 times or higher as compared to a residual ratio of bubbles contained in the frame-shaped resin portion 40. Furthermore, the residual ratio of bubbles contained in the frame-shaped resin portion 40 was 0.1% and, accordingly, it was possible to sufficiently increase a moisture-proof property of the package and maintain mechanical strength of the package.

The effect of the present invention is apparent from the present example.

Second Example

A package manufacturing method according to a second example will be described.

As the circuit board 1, a circuit board 1 with a total thickness being 10% thicker than that of the first example was used.

A difference from the first example is that the circuit board 1 is sandwiched by the top frame-shaped plane 37 of the frame-shaped protruding portion 39 of the mold 3 and the opposing plane 38 provided so as to oppose the top frame-shaped plane 37.

FIGS. 4A to 4D show a creation stage of the circuit board 1 according to the present example. These are diagrams showing enlargements of cross-sections taken at section D2 in the Z-direction plan view shown in FIG. 4A-1.

FIG. 4B shows step b or, in other words, a stage in which the uppermost conductor layer 141 formed in step a is patterned by lithography. The conductor layer 141 is a conductor layer 14 that comes into closest proximity to the top frame-shaped plane 37 in a state where the circuit board 1 is inserted into the mold 3 shown in FIG. 3A.

FIG. 4B-1 is a plan view of the circuit board 1 from the z direction in the stage of step b. As shown, the conductor layer 141 is provided with the frame-shaped opening 1411 in a portion sandwiched between two rectangular dashed lines. FIG. 4B also shows the frame-shaped opening 1411. As is apparent from a comparison between FIG. 4B and FIG. 3D, the frame-shaped opening 1411 is a portion where the top frame-shaped plane 37 of the mold 3 and the conductor layer 141 oppose each other. The frame-shaped opening 1411 is provided in this portion and a width kw thereof is greater than a width w of the top frame-shaped plane 37. The width kw was set to 0.62 mm and the width w to 0.3 mm.

FIG. 4C is a diagram showing step c or, in other words, a stage in which the solder resist layer 11 is formed. The solder resist layer 11 was formed by applying a liquid resist using a known roll coater and solidifying the liquid resist by applying heat or UV. In the stage of applying the liquid resist, a portion of the conductor layer 141 where a pattern is present and the frame-shaped opening 1411 where the pattern is not present had a same thickness of 30 μm. However, after curing, a thickness tk of the opening portion where the pattern was not present was 35 μm and a thickness td of the portion where the pattern was present was 28 μm, indicating an increase in thickness of 25%. This is because, before the liquid resist solidifies, the liquid resist flowed into the portion where the pattern is not present from the portion where the pattern is present and a leveling action took place in which a liquid surface moves to even itself out.

FIG. 4D shows step d or, in other words, a stage where exposure and a development process are performed on the cured resist layer 11 and an opening is opened in a desired portion of the circuit board 1 to complete the circuit board 1.

FIG. 4E is a state diagram which shows the circuit board 1 being inserted into the mold 3 and sandwiched by the top frame-shaped plane 37 and the opposing plane 38 and which is a same diagram as FIG. 3D. At this stage, the frame-shaped protruding portion 39 had bitten into the solder resist layer 11 and caused the solder resist layer 11 to deform. In addition, while a slight depression had also occurred in the prepreg layer 18 in the portion indicated by the arrow 22, the strength of the package did not become insufficient and moisture resistance of the package did not decline. This is because the thickness of the resist layer 11 formed in the frame-shaped opening 1411 which is a contact region with the frame-shaped protruding portion 39 was set thicker by 25% than other portions. While the total thickness of the circuit board 1 is thicker by 10%, the resist layer 11 effectively absorbs stress applied from the frame-shaped protruding portion 39 and deforms, and prevents damage to the prepreg layer 18 and the conductor layer 14.

FIG. 4F shows a stage where the resin 41 has flowed into the frame-shaped cavity 35 which is a part of the cavity of the mold 3. A solder resist with a low modulus of elasticity was used. Specifically, a solder resist with a modulus of elasticity of 3.4 GPa was used.

The effect of the present invention is apparent from the present example.

Other Embodiments

Embodiment(s) of the present invention can also be realized by a computer of a system or apparatus that reads out and executes computer executable instructions (e.g., one or more programs) recorded on a storage medium (which may also be referred to more fully as anon-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A method of manufacturing a package unit, comprising:
preparing a circuit board having a first region, a second region which surrounds the first region, and a third region between the first region and the second region;
preparing a mold having a frame-shaped protruding portion which surrounds a first cavity, the frame-shaped protruding portion partitioning the first cavity and a second cavity which surrounds the first cavity;
arranging the circuit board and the mold such that the first region of the circuit board faces the first cavity, the second region of the circuit board faces the second cavity, and a gap which communicates the first cavity and the second cavity with each other is formed between the frame-shaped protruding portion and the third region of the circuit board;
forming a frame-shaped resin member on top of the second region of the circuit board by pouring a resin into the second cavity; and
forming a lid fixed to the resin member.

2. The method according to claim 1, wherein the forming of the frame-shaped resin member further comprises pouring the resin such that a part of the resin penetrates into the gap from the second cavity.

3. The method according to claim 1, wherein the circuit board has a depressed portion at a position corresponding to the first cavity.

4. A package unit, comprising:
a circuit board having a first region, a second region which surrounds the first region, and a third region between the first region and the second region,
a resin member which covers the circuit board so as to surround a space above the first region of the circuit board; and
a lid fixed to the resin member,
wherein the resin member has (1) a first resin portion which is arranged above the second region of the circuit board and (2) a second resin portion which extends above the third region of the circuit board from the first resin portion and which has a thickness smaller than half of the first resin portion.

5. The package unit according to claim 4, wherein the second resin portion has a portion in which a length of the second resin portion in a direction toward the first region from the second region is greater than the thickness of the second resin portion.

6. The package unit according to claim 4, wherein the first resin portion contains a filler having a particle diameter greater than the thickness of the second resin portion.

7. The package unit according to claim 4, wherein thickness of the second resin portion is 5 and 50 μm, and
wherein the length of the second resin portion in a direction toward the first region from the second region is 1 mm or less.

8. The package unit according to claim 4, wherein the second resin portion has a hole on an opposite side to a circuit board side of the second resin portion.

9. The package unit according to claim 4, wherein the resin member includes a third resin portion which is continuous to the second resin portion on an opposite side to the first resin portion with respect to the second resin portion, and a thickness of the third resin portion is greater than the thickness of the second resin portion but smaller than a thickness of the first resin portion.

10. The package unit according to claim 9, wherein a lower end position of the third resin portion is lower than a lower end position of the second resin portion, and
wherein an upper end position of the third resin portion is higher than an upper end position of the second resin portion.

11. The package unit according to claim 4, wherein a depressed portion is provided on a surface of the third region of the circuit board, wherein a third resin portion which is continuous to the second resin portion is provided on an opposite side to the first resin portion with respect to the second resin portion, and wherein the third resin portion is positioned inside the depressed portion.

12. The package unit according to claim 11, wherein a distance between the depressed portion and an electrode provided on a front surface of the circuit board is shorter than a distance between the depressed portion and the first resin portion.

13. The package unit according to claim 12, wherein the distance between the depressed portion and the electrode is 0.05 to 1 mm, and a width of the depressed portion is 0.1 to 1 mm.

14. The package unit according to claim 4, wherein the resin member covers an end surface of the circuit board.

15. An electronic module, comprising:
the package unit according to claim 4, and
an electronic device arranged on the first region of the circuit board
wherein a thickness of the electronic device is smaller than a thickness of the first resin portion and greater than a thickness of the second resin portion.

16. An equipment, comprising:
the electronic module according to claim 15; and
an electric module connected to the circuit board via a flexible wiring.

17. An equipment, comprising:
the electronic module according to claim 15; and
a machine module which moves the electronic module.

18. An electronic module, comprising:
the package unit according to claim 4; and
an electronic device arranged on the first region of the circuit board,
wherein the electronic device is an imaging device or a display device, and
wherein a plurality of passive components are arranged on an opposite side to an electronic device side of the circuit board.

19. A package unit, comprising:
a circuit board having a first region, a second region which surrounds the first region, and a third region between the first region and the second region; and
a resin member which covers the second region of the circuit board so as to surround a space above the first region of the circuit board,
wherein a solder resist layer which is arranged in the third region is positioned between a conductor layer which is arranged in the first region and a conductor layer which is arranged in the second region.

20. The package unit according to claim 19, wherein a surface on an opposite side to a side of the circuit board of the solder resist layer arranged in the third region is a depressed surface.

* * * * *